United States Patent
Yao et al.

(10) Patent No.: US 12,462,733 B2
(45) Date of Patent: Nov. 4, 2025

(54) DISPLAY PANEL WITH SHARING MODE AND ANTI-PEEPING MODE, METHOD FOR DRIVING THE SAME, AND DISPLAY DEVICE

(71) Applicant: Shanghai Tianma Micro-Electronics Co., Ltd., Shanghai (CN)

(72) Inventors: Qijun Yao, Shanghai (CN); Yanbo Lou, Shanghai (CN); Shengtao Zhu, Shanghai (CN); Yang Zeng, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 18/622,445

(22) Filed: Mar. 29, 2024

(65) Prior Publication Data
US 2024/0242664 A1 Jul. 18, 2024

Related U.S. Application Data

(63) Continuation of application No. 18/062,204, filed on Dec. 6, 2022, now Pat. No. 11,967,271.

(30) Foreign Application Priority Data

Jul. 12, 2022 (CN) .......................... 202210822713.0

(51) Int. Cl.
*G09G 3/32* (2016.01)
*H01L 25/075* (2006.01)
*H10H 20/84* (2025.01)

(52) U.S. Cl.
CPC ........... *G09G 3/32* (2013.01); *H01L 25/0753* (2013.01); *H10H 20/84* (2025.01);
(Continued)

(58) Field of Classification Search
CPC ... G09G 3/32–3291; G09G 2300/0421; G09G 2300/0426; G09G 2300/0443;
(Continued)

(56) References Cited

U.S. PATENT DOCUMENTS

| 2005/0200573 | A1* | 9/2005 | Kwak | .................. | G09G 3/3233 345/76 |
| 2008/0143901 | A1* | 6/2008 | Kim | ..................... | G09G 3/3655 349/38 |

(Continued)

FOREIGN PATENT DOCUMENTS

| CN | 107768411 A | 3/2018 |
| CN | 114613284 A | 6/2022 |

OTHER PUBLICATIONS

Office Action mailed Jun. 16, 2025, issued in corresponding Chinese Application No. 202210822713.0, filed Jul. 12, 2022, 17 pages.

*Primary Examiner* — Nathan Danielsen
(74) *Attorney, Agent, or Firm* — CHRISTENSEN O'CONNOR JOHNSON KINDNESS PLLC

(57) ABSTRACT

A display panel including a substrate; a light-emitting element; and a light-shielding layer. The light-emitting element is located at a side of the substrate and includes a primary light-emitting element and an auxiliary light-emitting element. The light-shielding layer is located at a side of the light-emitting element facing away from the substrate and includes a first opening corresponding to the primary light-emitting element. The auxiliary light-emitting element is arranged at a periphery of the primary light-emitting element.

34 Claims, 27 Drawing Sheets

(52) U.S. Cl.
CPC ............... *G09G 2300/0443* (2013.01); *G09G 2300/0804* (2013.01); *G09G 2300/0814* (2013.01); *G09G 2310/0262* (2013.01); *G09G 2310/061* (2013.01); *G09G 2320/0233* (2013.01); *G09G 2320/068* (2013.01); *G09G 2358/00* (2013.01)

(58) Field of Classification Search
CPC ... G09G 2300/0804; G09G 2300/0814; G09G 2300/0819; G09G 2300/0861; G09G 2310/0262; G09G 2310/0264; G09G 2310/0267; G09G 2310/06; G09G 2310/08; G09G 2358/00; H01L 25/0753; H01L 25/167; H01L 33/44; H01L 33/58
See application file for complete search history.

(56) References Cited

U.S. PATENT DOCUMENTS

| | | | |
|---|---|---|---|
| 2014/0293172 A1* | 10/2014 | Suzuki | G09G 3/003 359/462 |
| 2019/0280174 A1* | 9/2019 | Okahisa | H01L 27/156 |
| 2019/0325812 A1* | 10/2019 | Mao | G06F 3/1446 |
| 2021/0399061 A1* | 12/2021 | Ji | H10K 59/352 |
| 2022/0093668 A1* | 3/2022 | Kim | H01L 27/14685 |

* cited by examiner

DISPLAY PANEL WITH SHARING MODE AND ANTI-PEEPING MODE, METHOD FOR DRIVING THE SAME, AND DISPLAY DEVICE

CROSS-REFERENCE TO RELATED APPLICATIONS

This application is a continuation of U.S. application Ser. No. 18/062,204, filed on Dec. 6, 2022, which claims priority to Chinese Patent Application No. 202210822713.0, filed on Jul. 12, 2022, the content of which is incorporated herein by reference in its entirety.

TECHNICAL FIELD

The present disclosure relates to the technical field of displaying, and in particular, to a display panel and a method for driving the display panel, and a display device.

BACKGROUND

With the continuous development of network technology, more and more users need to perform operations such as account transactions on display devices. However, when users perform the above operations in public places, personal information may be easily leaked by accessing bank accounts, paying bills, or entering personal information, and the users suffer the risk of identity theft and privacy invasion. Therefore, display devices with anti-peeping functions have received more and more attention.

The display panel is usually provided with a grating structure on a light-exiting surface of the display panel to form an anti-peeping film. The grating structure can block the light emitted in a large viewing angle, thereby changing a wide viewing angle of the screen into a narrow viewing angle, thereby achieving the anti-peeping function. However, if the grating structure is set in the display panel, the display panel can only be kept in the anti-peeping mode. When multiple users need to view the screen at the same time, it will cause inconvenience and affect the user's experience.

SUMMARY

In view of the above, a display panel, a method for driving the display panel, and a display device are provided in embodiments of the present disclosure to solve a problem that a display mode of the existing display panel is simple.

In a first aspect, an embodiment of the present disclosure provides a display panel including: a substrate, a light-emitting element, and a light-shielding layer. The light-emitting element is located at a side of the substrate and includes a primary light-emitting element and an auxiliary light-emitting element. The light-shielding layer is located at a side of the light-emitting element facing away from the substrate and includes a first opening corresponding to the primary light-emitting element. The auxiliary light-emitting element is arranged at a periphery of the primary light-emitting element.

In a second aspect, an embodiment of the present disclosure provides a method for driving the display panel described above, and the display panel has a display mode including a sharing mode and an anti-peeping mode. The method includes in the sharing mode, driving both the primary light-emitting element and the auxiliary light-emitting element to emit light; and in the anti-peeping mode, driving the primary light-emitting element to emit light and driving the auxiliary light-emitting element not to emit light.

In a third aspect, an embodiment of the present disclosure provides a display device including the display panel described above.

The technical schemes described above have the following beneficial effects.

In the embodiments of the present disclosure, the light-shielding layer is arranged at a side of the light-emitting element facing away from the substrate, mutual switching between different display modes of the display panel can be achieved based on the relative position relationship between the primary light-emitting element, the auxiliary light-emitting element and the first opening, and the cooperation of the light-emitting states of the primary light-emitting element and the auxiliary light-emitting element.

In an example, when both the primary light-emitting element and the auxiliary light-emitting element are controlled to emit light, the light emitted by the primary light-emitting element exits through the first opening above the primary light-emitting element. When exiting the display panel, these lights will travel in a direction of a small viewing angle that is close to a frontal viewing angle. At the same time, the light emitted by the auxiliary light-emitting element exits through the first opening obliquely above the auxiliary light emitting element. When exiting the display panel, these lights will travel obliquely in a direction of a large viewing angle. Therefore, in this control mode, these two parts of light will make the display panel have a larger viewing range. At this time, the display panel is in the sharing mode, and the viewer can normally see the displayed image at different viewing angles.

When only the primary light-emitting element is controlled to emit light and the auxiliary light-emitting element does not emit light, only the light emitted by the primary light-emitting element exits the display panel through the first opening. Since these lights tends to travel in a direction of the frontal viewing angle, the display panel will only have a narrow viewing range. At this time, the display panel is in the anti-peeping mode, and the user can only see the displayed image at the frontal viewing angle and cannot see the displayed image at a position at the oblique viewing angle, so the privacy of the user is well protected.

As a result, in the embodiments of the present disclosure, by arranging the light-emitting element to include the primary light-emitting element and the auxiliary light-emitting element, and arranging the light-shielding layer including the first opening above the light-emitting element, the viewing angle range of the display panel can be controlled by controlling the light-emitting state of the auxiliary light-emitting element, so that the display panel can be switched between different display modes, and the display mode control of the display panel is more flexible, thereby improving the use experience.

BRIEF DESCRIPTION OF DRAWINGS

In order to better explain technical solutions in embodiments of the present disclosure, the drawings used in the embodiments will be briefly introduced below. Obviously, the drawings in the following description are merely some of the embodiments of the present disclosure, and other drawings can be obtained for those skilled in the art according to these drawings without paying creative efforts.

DESCRIPTION OF EMBODIMENTS

For better illustrating the technical solutions of the present disclosure, the embodiments of the present disclosure are described in detail below with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing embodiments, rather than limiting the present disclosure. The singular form "a", "an", "the" and "said" used in the embodiments and claims shall be interpreted as also including the plural form, unless indicated otherwise in the context.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

Figure 1:
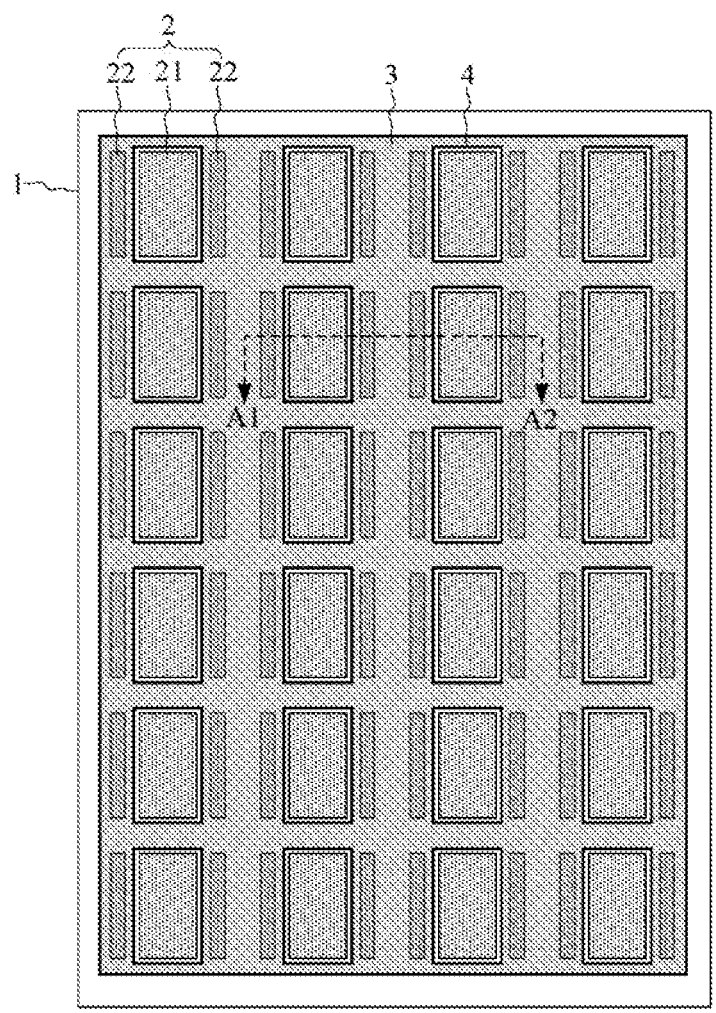
FIG. 1 is a top view of a display panel according to an embodiment of the present disclosure.
Figure 2:
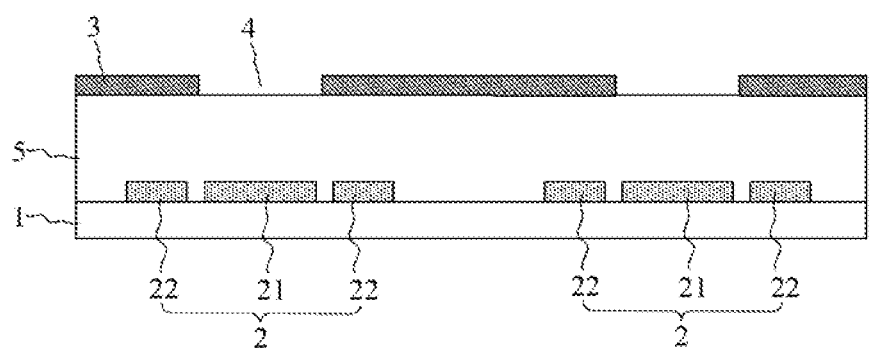
FIG. 2 is a cross-sectional view of the display panel in FIG. 1 taken along A1-A2.

An embodiment of the present disclosure provides a display panel. FIG. 1 is a top view of a display panel according to an embodiment of the present disclosure, and FIG. 2 is a cross-sectional view of the display panel in FIG. 1 taken along A1-A2. As shown in FIG. 1 and FIG. 2, the display panel includes a substrate 1, a light-emitting element 2 located at a side of the substrate 1, and a light-shielding layer 3 located at a side of the light-emitting element 2 facing away from the substrate 1.

The light-emitting element 2 includes a primary light-emitting element 21 and an auxiliary light-emitting element 22. The light-shielding layer 3 includes a first opening 4 provided corresponding to the primary light-emitting element 21. The auxiliary light-emitting element 22 is provided at a periphery of the primary light-emitting element 21. In addition, as shown in FIG. 2, a function layer 5 may be provided between the light-emitting element 2 and the light-shielding layer 3, and the function layer 5 may include an encapsulation film, an optical adhesive film, and the like.

It should be noted that, the first opening 4 corresponding to the primary light-emitting element 21 means that the first opening 4 is located directly above the primary light-emitting element 21, and in a direction perpendicular to a plane of the substrate 1, the first opening 4 at least partially overlaps with the primary light-emitting element 21.

When the auxiliary light-emitting element 22 is located at a periphery of the primary light-emitting element 21, the auxiliary light-emitting element 22 is offset from the first opening 4, that is, the first opening 4 is located obliquely above the auxiliary light-emitting element 22 (i.e., the first opening 4 is located above the auxiliary light-emitting element 22 and offset from the auxiliary light-emitting element 22). In the direction perpendicular to the plane of the substrate 1, a distance between a center point of the auxiliary light-emitting element 22 and a center point of the first opening 4 is greater than a distance between a center point of the primary light-emitting element 21 and the center point of the first opening 4.

Figure 3:
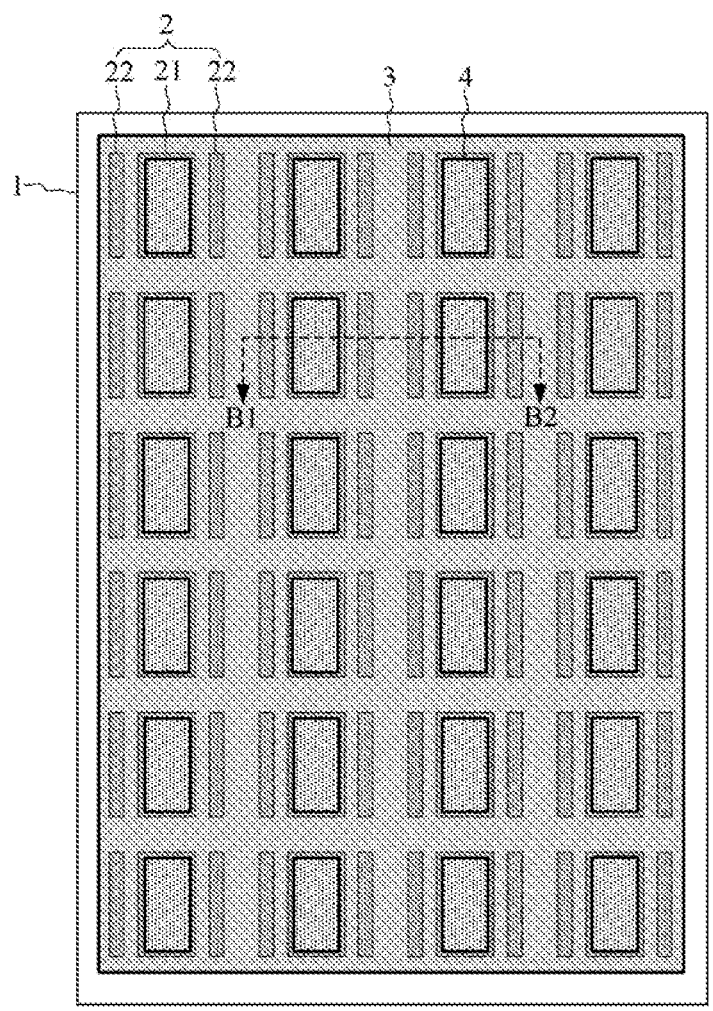
FIG. 3 is another top view of a display panel according to an embodiment of the present disclosure.
Figure 4:
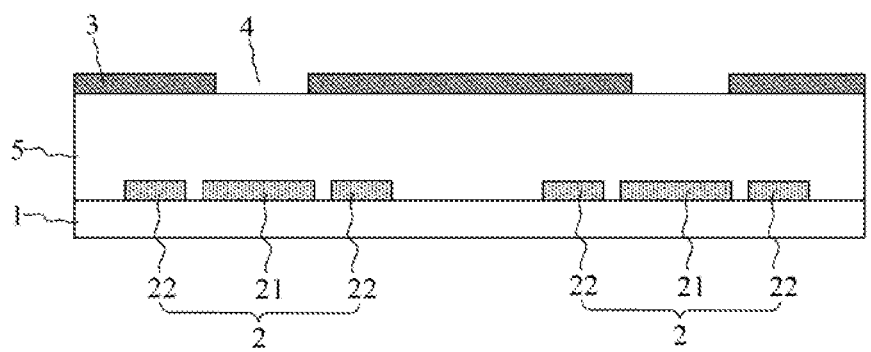
FIG. 4 is a cross-sectional view of the display panel in FIG. 3 taken along B1-B2.

Alternatively, in another expression, in the direction perpendicular to the plane of the substrate 1, the light-shielding layer 3 at least partially shields the auxiliary light-emitting element 22. Exemplarily, please refer to FIG. 1 and FIG. 2, when an area of the first opening 4 is greater than an area of the primary light-emitting element 21, in the direction perpendicular to the plane of the substrate 1, the primary light-emitting element 21 is within the first opening 4. In this case, the auxiliary light-emitting element 22 is partially shielded by the light-shielding layer 3, and a small part of the auxiliary light-emitting element 22 may overlap with the first opening 4. Alternatively, FIG. 3 is another top view of a display panel according to an embodiment of the present disclosure, and FIG. 4 is a cross-sectional view of the display panel in FIG. 3 taken along B1-B2, as shown in FIG. 3 and FIG. 4, when the area of the first opening 4 is smaller than an area of the primary light-emitting element 21, in the direction perpendicular to the plane of the substrate 1, a part of the primary light-emitting element 21 overlaps with the first opening 4. In this case, the light-shielding layer 3 completely covers the auxiliary light-emitting element 22, that is, in the direction perpendicular to the plane of the substrate 1, at least a part of the primary light-emitting element 21 is exposed by the first opening 4, and the first opening 4 does not overlap with the auxiliary light-emitting element 22.

In the embodiments of the present disclosure, the light-shielding layer 3 is disposed at a side of the light-emitting element 2 facing away from the substrate 1, and switching between different display modes of the display panel can be achieved based on the relative position relationship between the primary light-emitting element 21, the auxiliary light-emitting element 22 and the first opening 4, and the cooperation of a light-emitting state of the primary light-emitting element 21 and a light-emitting state of the auxiliary light-emitting element 22.

Figure 5:
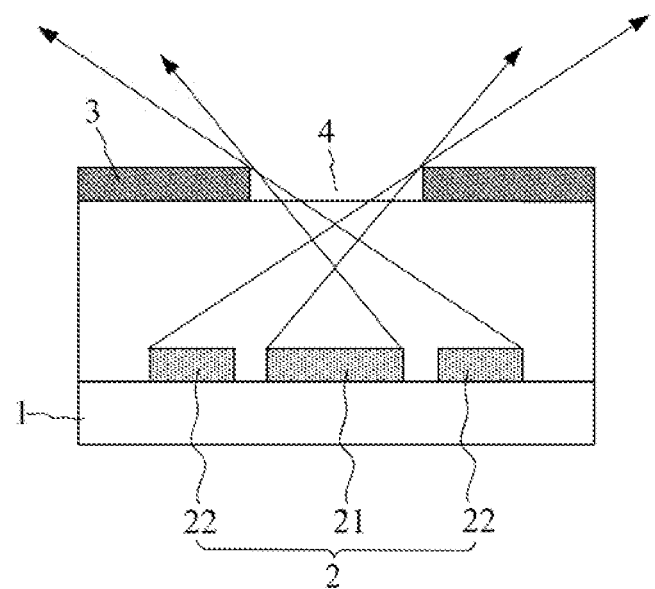
FIG. 5 is a schematic diagram showing exiting light of a display panel in a sharing mode according to an embodiment of the present disclosure.

FIG. 5 is a schematic diagram showing exiting light of a display panel in a sharing mode according to an embodiment. In FIG. 5, the arrows indicate the propagation directions and paths of the light. In an example, when both the primary light-emitting element 21 and the auxiliary light-emitting element 22 are controlled to emit light, as shown in FIG. 5, the light emitted by the primary light-emitting element 21 passes through the first opening 4 above the primary light-emitting element 21, these light travels in a direction having a small viewing angle close to a frontal viewing angle when exiting the display panel; at the same time, the light emitted by the auxiliary light-emitting element 22 passes through the first opening 4 obliquely above the auxiliary light-emitting element 22, and these light tends to travel obliquely in a direction having a large viewing angle when exiting the display panel. In this control mode, these two parts of light will make the display panel have a larger viewing range. In this case, the display panel is in a sharing mode, and the viewer can normally see the displayed image from different viewing angles.

Figure 6:
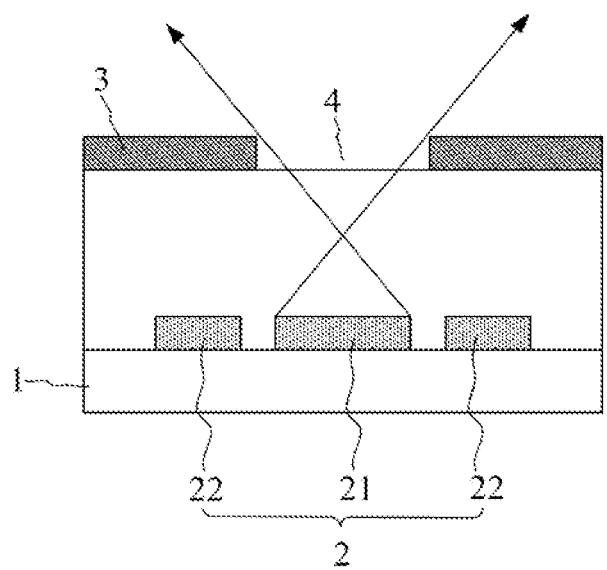
FIG. 6 is a schematic diagram showing exiting light of a display panel in an anti-peeping mode according to an embodiment of the present disclosure.

FIG. 6 is a schematic diagram showing exiting light of a display panel in an anti-peeping mode according to an embodiment of the present disclosure. As shown in FIG. 6, when only the primary light-emitting element 21 is controlled to emit light and the auxiliary light-emitting element 22 does not emit light, only the light emitted by the primary light-emitting element 21 exits the display panel through the first opening 4. Since this light tends to travel in a direction of the frontal viewing angle, the display panel only has a narrower viewing range. In this case, the display panel is in an anti-peeping mode, and the user can see the displayed image only at the frontal viewing angle and cannot see the displayed image at an oblique viewing angle, thereby protecting the user's privacy well.

To sum up, in the embodiments of the present disclosure, the light-emitting element 2 includes the primary light-emitting element 21 and the auxiliary light-emitting element 22, and the light-shielding layer 3 including the first opening 4 is arranged above the light-emitting element 2, so that the light-exiting angle range of the display panel can be adjusted by controlling the light-emitting state of the auxiliary light-emitting element 22, thereby achieving switching between different display modes of the display panel. Therefore, the controlling of the display mode of the display panel is more flexible, and the user experience is improved.

In addition, it should be further noted that, whether in the sharing mode or in the anti-peeping mode, the user is more likely to view the displayed image at the frontal viewing angle. Therefore, in the embodiments of the present disclosure, an area of the primary light-emitting element 21 is greater than an area of the auxiliary light-emitting element 22, so as to increase the brightness of the light emitted within the frontal viewing angle range and optimize the display effect of the display panel at the frontal viewing angle. Moreover, in the same light-emitting element 2, the color of the light of the primary light-emitting element 21 and the color of the light emitted by the auxiliary light-emitting element 22 may be the same.

In some embodiments, the display mode of the display panel includes an anti-peeping mode and a sharing mode. In the sharing mode, the primary light-emitting element 21 emits light, and the auxiliary light-emitting element 22 also emits light; and in the anti-peeping mode, the primary light-emitting element 21 emits light, and the auxiliary light-emitting element 22 does not emit light.

According to the above description, in the sharing mode, by controlling both the primary light-emitting element 21 and the auxiliary light-emitting element 22 to emit light, the display panel has a larger viewing angle range, and when multiple people view the displayed image at the same time, the viewing experience can be improved. In the anti-peeping mode, by controlling only the primary light-emitting element 21 to emit light, the display panel has a narrower viewing range, thereby improving the privacy protection effect and ensuring that the user's privacy is protected.

Figure 7:
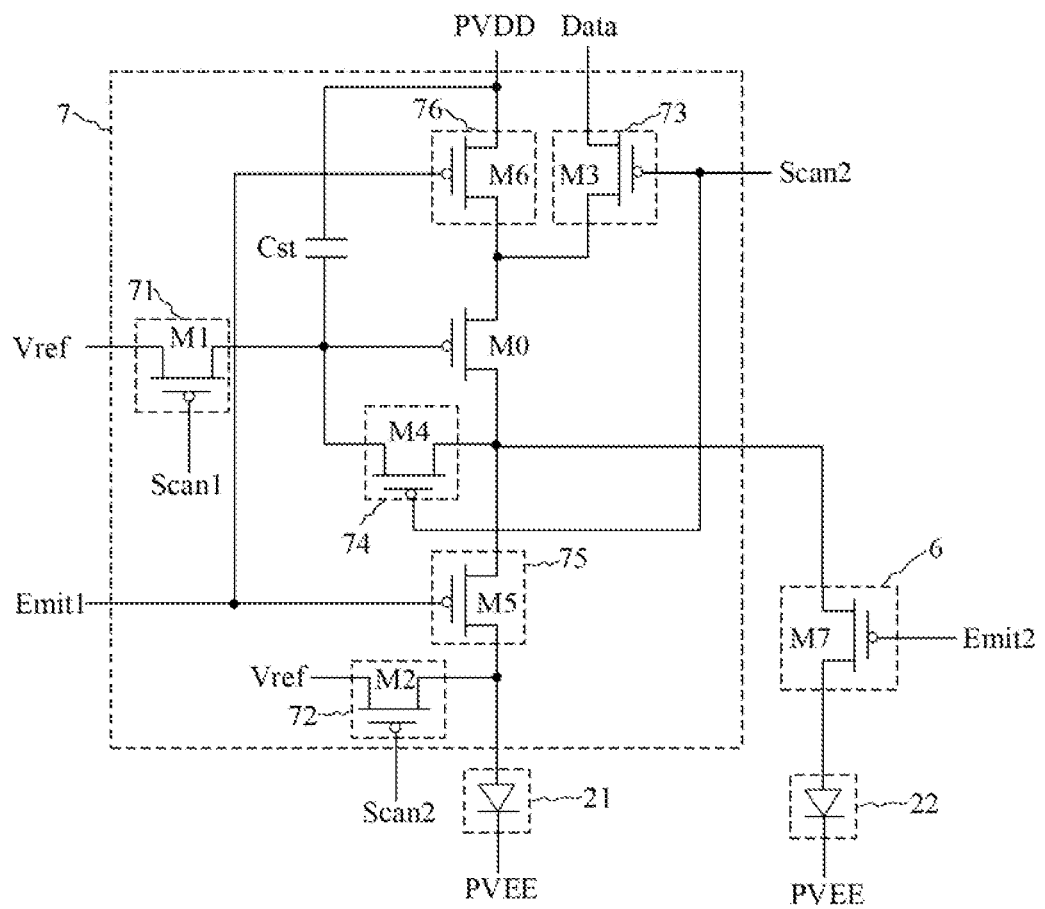
FIG. 7 is a schematic diagram showing connection of a pixel driving circuit, a mode controlling module, and a light-emitting element according to an embodiment of the present disclosure.

FIG. 7 is a schematic diagram showing connection of a pixel driving circuit 7, a mode controlling module 6, and the light-emitting element 2 according to an embodiment of the present disclosure. In some embodiments, as shown in FIG. 7, the display panel further includes a mode controlling module 6, and the mode controlling module 6 is configured to control a light-emitting state of the auxiliary light-emitting element 22 according to the display mode of the display panel. In an example, in the sharing mode, the mode controlling module 6 controls the auxiliary light-emitting element 22 to emit light; and in the anti-peeping mode, the mode controlling module 6 controls the auxiliary light-emitting element 22 not to emit light.

The display panel further includes a pixel driving circuit 7. The pixel driving circuit 7 is electrically connected to the primary light-emitting element 21, and the pixel driving circuit 7 is further connected to the auxiliary light-emitting element 22 through the mode controlling module 6.

Figure 8:
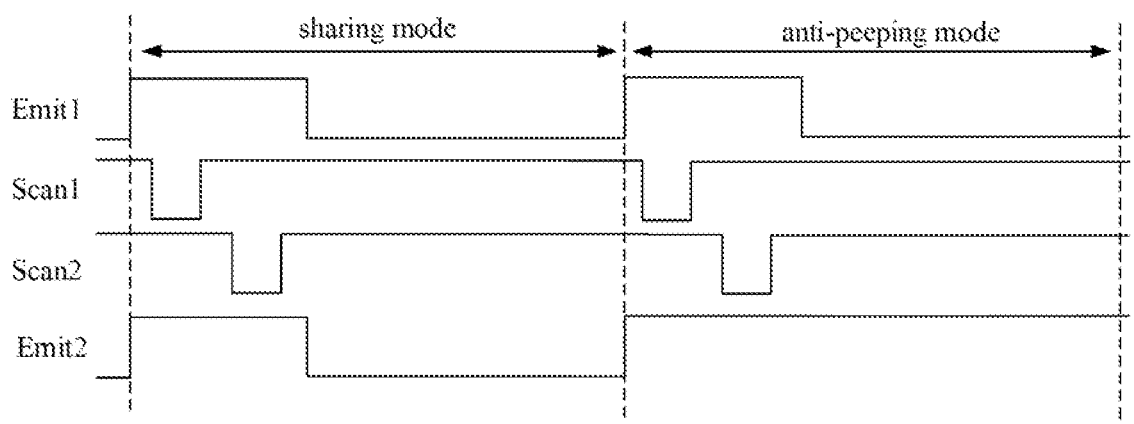
FIG. 8 is a timing diagram according to an embodiment of the present disclosure.

FIG. 8 is a timing diagram according to an embodiment of the present disclosure. In a configuration, as shown in FIG. 7 and FIG. 8, the pixel driving circuit 7 may include a driving transistor M0, a gate reset module 71, an anode reset module 72, a data input module 73, a threshold compensation module 74, a first light-emitting control module 75, a third light-emitting control module 76, and a storage capacitor Cst.

The gate reset module 71 includes a gate reset transistor M1, and the gate reset transistor M1 is electrically connected between a reset signal line Vref and a gate of the driving transistor M0. The gate reset transistor M1 is configured to reset the gate of the gate of the driving transistor M0 in response to a low level provided by a first scanning signal line Scan1. The anode reset module 72 includes an anode reset transistor M2, and the anode reset transistor M2 is electrically connected between the reset signal line Vref and the primary light-emitting element 21. The anode reset transistor M2 is configured to reset an anode potential of the primary light-emitting element 21 in response to a low level provided by a second scanning signal line Scan2.

The data input module 73 includes a data input transistor M3, and the data input transistor M3 is electrically connected between a data line Data and a first electrode of the driving transistor M0. The threshold compensation module 74 includes a threshold compensation transistor M4, and the threshold compensation transistor M4 is electrically connected between a second electrode of the driving transistor M0 and the gate of the driving transistor M0. In response to a low level provided by the second scanning signal line Scan2, the data input transistor M3 and the threshold compensation transistor M4 are configured to input a data voltage to the gate of the driving transistor M0 and compensate a threshold of the driving transistor M0.

The first light-emitting control module 75 includes a first light-emitting control transistor M5, and a gate of the first light-emitting control transistor M5 is electrically connected between a second electrode of the driving transistor M0 and the primary light-emitting element 21. The third light-emitting control module 76 includes a third light-emitting control transistor M6, and the third light-emitting control transistor M6 is electrically connected between a power supply signal line PVDD and the first electrode of the driving transistor M0. In response to a first enable level (a low level) provided by a first light-emitting control signal line Emit1, the first light-emitting control transistor M5 and the third light-emitting control transistor M6 are configured to send a driving current converted by the driving transistor M0 to the primary light-emitting element 21 so as to drive the primary light-emitting element 21 to emit light.

In this configuration, the mode controlling module 6 may be an additional structure independent of the pixel driving circuit 7. In the sharing mode, the pixel driving circuit 7 sends, in response to the first enable level (a low level) provided by the first light-emitting control signal line Emit1, a driving current converted by the driving transistor M0 to the primary light-emitting element 21 so as to drive the primary light-emitting element 21 to emit light, while the mode controlling module 6 controls a transmission path between the pixel driving circuit 7 and the auxiliary light-emitting element 22 to be conductive, such that the driving current converted by the driving transistor M0 is synchronously sent to the auxiliary light-emitting element 22 so as to drive the auxiliary light-emitting element 22 to emit light simultaneously. In the anti-peeping mode, the pixel driving circuit 7 sends, in response to a first enable signal (a low level) provided by the first light-emitting control signal line Emit1, the driving current converted by the driving transistor M0 to the primary light-emitting element 21 so as to drive the primary light-emitting element 21 to emit light, while the mode controlling module 6 controls a transmission path between the pixel driving circuit 7 and the auxiliary light-emitting element 22 to be disconnected, such that the driving current converted by the driving transistor M0 cannot flow to the auxiliary light-emitting element 22, and the auxiliary light-emitting element 22 does not emit light.

Based on the structure described above, in the sharing mode, the auxiliary light-emitting element 22 and the primary light-emitting element 21 emit light by sharing a driving current provided by the same pixel driving circuit 7. On the one hand, the brightness of the auxiliary light-emitting element 22 is the same as the brightness of the primary light-emitting element 21, thereby optimizing the light-emitting effect of a single light-emitting element 2. On the other hand, it is not necessary to provide an additional circuit for providing the driving current for the auxiliary light-emitting element 22, thereby simplifying a circuit design of the display panel and saving the space occupied by the driving circuit in the display panel, as well as being beneficial to improving the pixel density.

Figure 9:
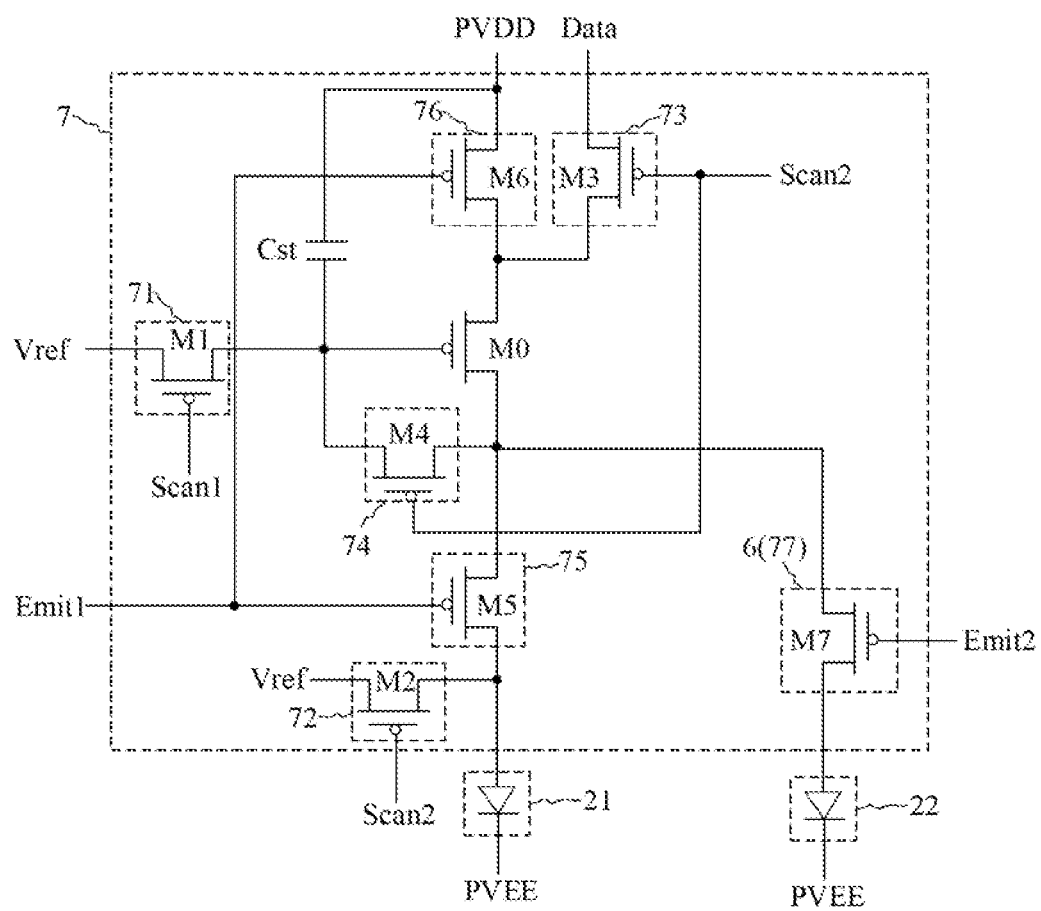
FIG. 9 is another schematic diagram showing connection of a pixel driving circuit, a mode controlling module, and a light-emitting element according to an embodiment of the present disclosure.

FIG. 9 is another schematic diagram showing connection of a pixel driving circuit 7, a mode controlling module 6, and a light-emitting element 2 according to an embodiment of the present disclosure. In some embodiments, as shown in FIG. 9, the display panel further includes a mode controlling module 6, and the mode controlling module 6 is configured to control a light-emitting state of the auxiliary light-emitting element 22 according to the display mode of the display panel. In an example, in the sharing mode, the mode controlling module 6 controls the auxiliary light-emitting element 22 to emit light; and in the anti-peeping mode, the mode controlling module 6 controls the auxiliary light-emitting element 22 not to emit light.

The display panel further includes a pixel driving circuit 7, and the pixel driving circuit 7 includes a driving transistor M0, a first light-emitting control module 75, and a second light-emitting control module 77. The first light-emitting control module 75 is electrically connected between a second electrode of the driving transistor M0 and the primary light-emitting element 21. The second light-emitting control module 77 is electrically connected between the second electrode of the driving transistor M0 and the auxiliary light-emitting element 22. The mode controlling module 6 is reused as the second light-emitting control module 77.

The pixel driving circuit 7 may further include a gate reset module 71, an anode reset module 72, a data input module 73, a threshold compensation module 74, and a third light-emitting control module 76. A specific structure and an operation principle of each module have been described in the foregoing embodiments and are not repeated herein.

In this configuration, the mode controlling module 6 may be reused as the second light-emitting control module 77 in the pixel driving circuit 7. In the sharing module, the first light-emitting control module 75 controls to send the driving current converted by the driving transistor M0 to the primary light-emitting element 21 so as to drive the primary light-emitting element 21 to emit light; and the second light-emitting control module 77 (the mode controlling module 6) controls to send a driving current converted by the driving transistor M0 to the auxiliary light-emitting element 22 so as to drive the auxiliary light-emitting element 22 to emit light. In the anti-peeping mode, the first light-emitting control module 75 controls to send a driving current converted by the driving transistor M0 to the primary light-emitting element 21 so as to drive the primary light-emitting element 21 to emit light; while the second light-emitting control module 77 (the mode controlling module 6) controls a driving current converted by the driving transistor M0 not to flow to the auxiliary light-emitting element 22 so as to control the auxiliary light-emitting element 22 not to emit light.

Based on the structure described above, in the sharing mode, the auxiliary light-emitting element 22 and the primary light-emitting element 21 emit light by sharing a driving current provided by a same pixel driving circuit 7. On the one hand, the auxiliary light-emitting element 22 and the primary light-emitting element 21 in a same light-emitting element 2 have a same brightness, thereby optimizing the light-emitting effect of a single light-emitting element 2. On the other hand, a circuit design of the display panel is simplified, and the pixel density is improved.

Furthermore, please refer to FIG. 7 and FIG. 9, the second light-emitting control module 77 may include a second light-emitting control transistor M7, and the second light-emitting control transistor M7 is electrically connected between the second electrode of the driving transistor M0 and the auxiliary light-emitting element 22. The second light-emitting control transistor M7 is configured to be turned on in the sharing mode and be turned off in the anti-peeping mode.

In some embodiments, please refer to FIG. 7 and FIG. 9, the pixel driving circuit 7 is electrically connected to the first light-emitting control signal line Emit1, and the mode controlling module 6 is electrically connected to the second light-emitting control signal line Emit2. In an example, in the pixel driving circuit 7, a gate of the first light-emitting control transistor M5 is electrically connected to the first light-emitting control signal line Emit1, and a gate of the second light-emitting control transistor M7 is electrically connected to the second light-emitting control signal line Emit2.

Figure 10:
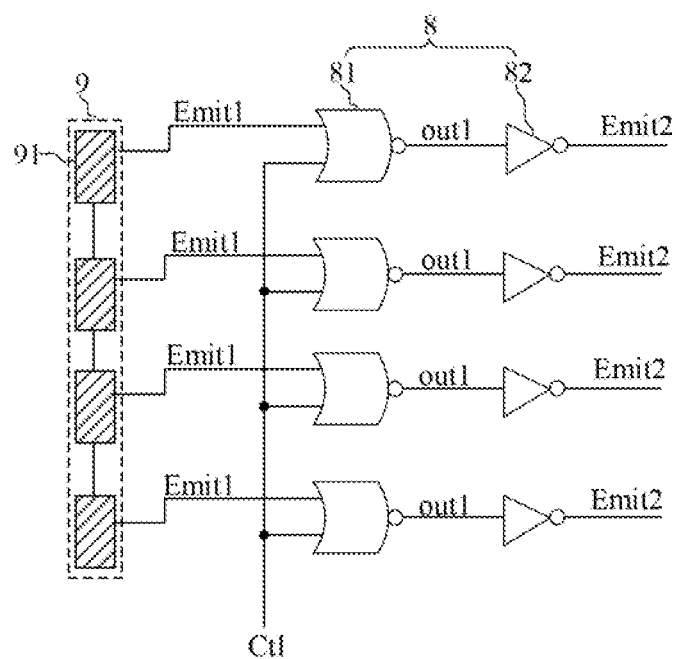
FIG. 10 is a schematic diagram showing a structure of a regulating module according to an embodiment of the present disclosure.

FIG. 10 is a schematic diagram showing a structure of a regulating module 8 according to an embodiment of the present disclosure. As shown in FIG. 10, the display panel further includes a regulating module 8, and the regulating module 8 is electrically connected to the first light-emitting control signal line Emit1 and the second light-emitting control signal line Emit2, respectively. In the sharing mode, the regulating module 8 is configured to generate a second enable level according to a first enable level outputted by the first light-emitting control signal line Emit1 and output the second enable level to the second light-emitting control signal line Emit2. In the anti-peeping mode, the regulating module 8 is configured to generate a second disable level according to a first enable level or a first disable level outputted by the first light-emitting control signal line Emit1, and output the second disable level to the second light-emitting control signal line Emit2.

In an example, in the sharing mode, when the first light-emitting control signal line Emit1 outputs a first enable level, the regulating module 8 outputs a second enable level to the second light-emitting control signal line Emit2 according to the first enable level, so as to control the primary light-emitting element 21 and the auxiliary light-emitting element 22 to emit light synchronously, thereby enlarging the viewing angle rang. In the anti-peeping mode, whether the first light-emitting control signal line Emit1 outputs a first enable level or a first disable level, the regulating module 8 outputs a second disable level to the second light-emitting control signal line Emit2 so as to cause the auxiliary light-emitting element 22 not to emit light, thereby narrowing the viewing angle range.

It can be understood that the display panel is generally provided with a shift circuit for supplying signals for signal lines such as a light-emitting control signal line and a scanning signal line. Taking a light-emitting shift circuit electrically connected to the first light-emitting control signal line Emit1 as an example, the light-emitting shift circuit includes a plurality of shift units that are cascaded, and each shift unit is electrically connected to a respective one first light-emitting control signal line Emit1 and transmits a first light-emitting control signal to multiple pixel driving circuits 7 that are electrically connected to the respective one first light-emitting control signal line Emit1. In combination with the directions shown in FIG. 14, multiple pixel driving circuits 7 that are electrically connected to one first light-emitting control signal line Emit1 may be arranged in a first direction x, or may be arranged in a second direction y.

In the configuration described above, please refer to FIG. 10, for the display panel, only a light-emitting shift circuit 9 including a plurality shift units 91 needs to be provided for supplying a first light-emitting control signal to the first light-emitting control signal line Emit1, and the regulating module 8 supplies a second light-emitting control signal to the second light-emitting control signal line Emit2 according to the first light-emitting control signal. It is not necessary to provide an additional light-emitting shift circuit for the second light-emitting control signal lines Emit2, thereby reducing the number of light-emitting shift circuit required in the display panel, and thus being beneficial to realizing a narrow frame of the display panel.

Further, the first enable level and the second enable level each are a low level. That is, both the first light-emitting control transistor M5 and the second light-emitting control transistor M7 are P-type transistors.

Please refer to FIG. 10, the regulating module 8 includes a NOR gate 81 and an inverter 82. A first input terminal of the NOR gate 81 is electrically connected to the first light-emitting control signal line Emit1, and a second input terminal of the NOR gate 81 is electrically connected to a regulating signal line Ctl. The regulating signal line Ctl is configured to supply a low level in the sharing mode and supply a high level in the anti-peering mode. The NOR gate 81 is configured to: output a low level in response to at least one of the first input terminal or the second input terminal receiving a high level; and output a high level in response to both the first input terminal and the second input terminal receiving a low level. An input terminal of the inverter 82 is electrically connected to an input terminal of the inverter 82, and an output terminal of the inverter 82 is electrically connected to the second light-emitting control signal line Emit2.

Figure 11:
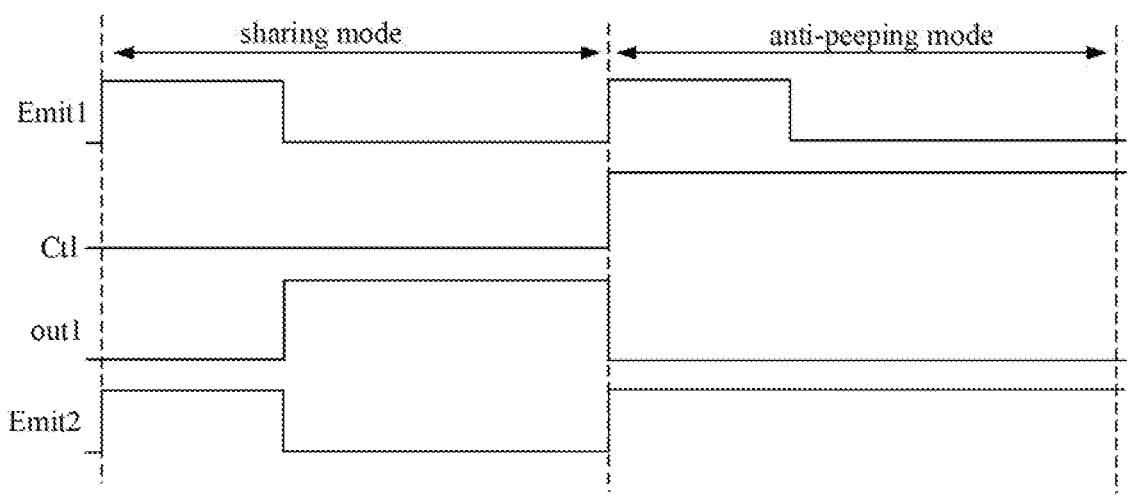
FIG. 11 is another timing diagram according to an embodiment of the present disclosure.

FIG. 11 is another timing diagram according to an embodiment of the present disclosure. As shown in FIG. 10 and FIG. 11, in the sharing mode, the regulating signal line Ctl outputs a low level. When the first light-emitting control signal line Emit1 outputs a high level, the NOR gate 81 outputs a low level, and the inverter 82 outputs a high level (a second disable level) to the second light-emitting control signal line Emit2 according to the low level outputted by the NOR gate 81, so as to control the auxiliary light-emitting element 22 not to emit light. When the first light-emitting control signal line Emit1 outputs a low level, the NOR gate 81 outputs a high level, and the inverter 82 outputs a low level (a second enable level) to the second light-emitting control signal line Emit2 according to the high level outputted by the NOR gate 81, so as to control the auxiliary light-emitting element 22 to emit light.

In the anti-peering mode, the regulating signal line Ctl outputs a high level. In this case, whether the first light-emitting control signal line Emit1 outputs a high level or a low level, the NOR gate 81 outputs a low level, and the inverter 82 outputs a high level (a second disable level) according to the low level outputted by the NOR gate 81, so as to control the auxiliary light-emitting element 22 not to emit light.

Figure 12:
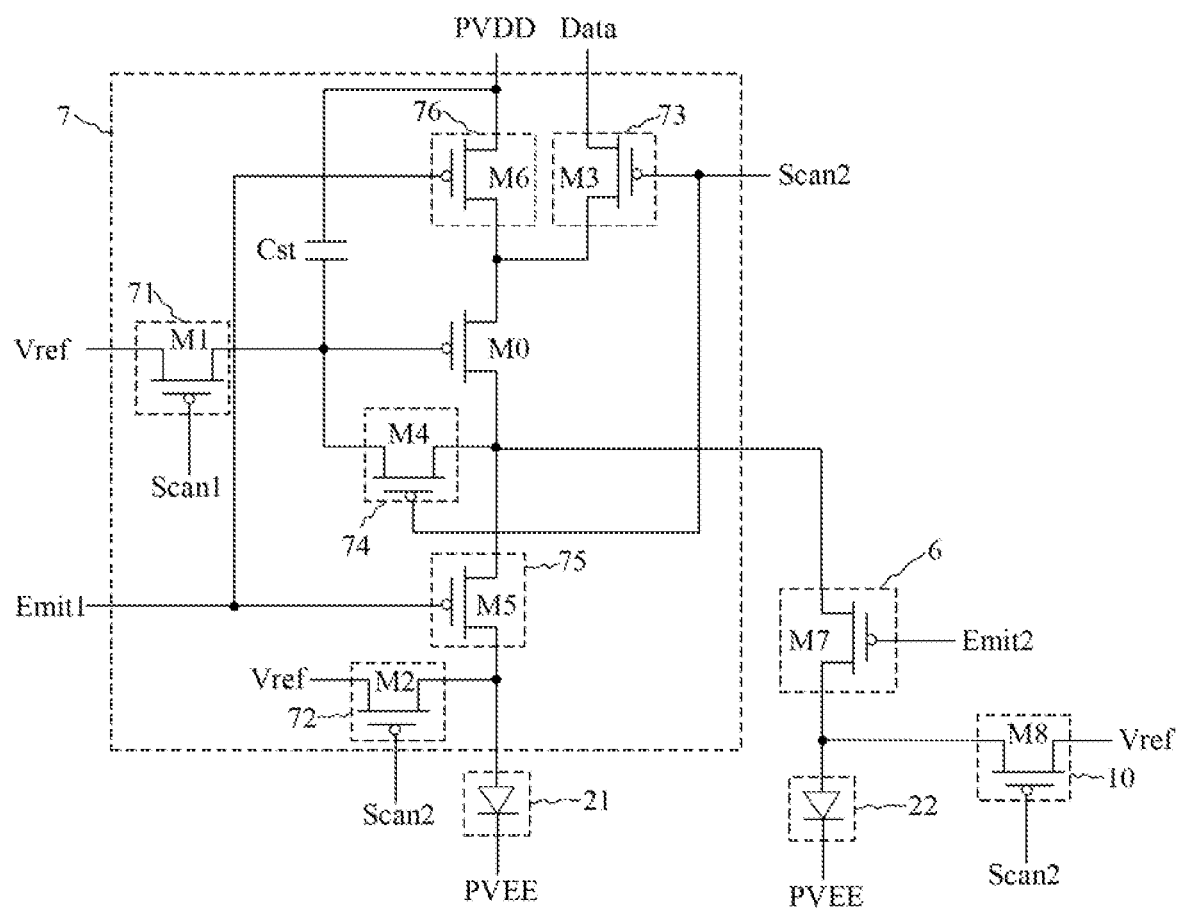
FIG. 12 is a schematic diagram showing connection of a pixel driving circuit, a mode controlling module, a first rest controlling module, and a light-emitting element according to an embodiment of the present disclosure.

FIG. 12 is a schematic diagram showing connection of a pixel driving circuit 7, a mode controlling module 6, a first rest controlling module 10, and a light-emitting element 2 according to an embodiment of the present disclosure. In some embodiments, as shown in FIG. 12, the display panel further includes: a first reset controlling module 10. The first reset controlling module 10 is electrically connected between a reset signal line and the auxiliary light-emitting element 22. In an example, the first reset controlling module 10 may include a first reset transistor M8. A gate of the first reset transistor M8 is electrically connected to a second scanning signal line Scan2, a first electrode of the first reset transistor M8 is electrically connected to the reset signal line Vref, and a second electrode of the first reset transistor M8 is electrically connected to the auxiliary light-emitting element 22.

When the second scanning signal line Scan2 supplies a low level, the first reset controlling module 10 controls a connection path between the reset signal line Vref and the auxiliary light-emitting element 22 to be conductive, and an anode potential of the auxiliary light-emitting element 22 is reset by the reset signal, such that the initialization of the anode potential of the auxiliary light-emitting element 22 is achieved. Therefore, the brightness of the auxiliary light-emitting element 22 in a current frame is not influenced by a residual potential in a previous frame.

Figure 13:
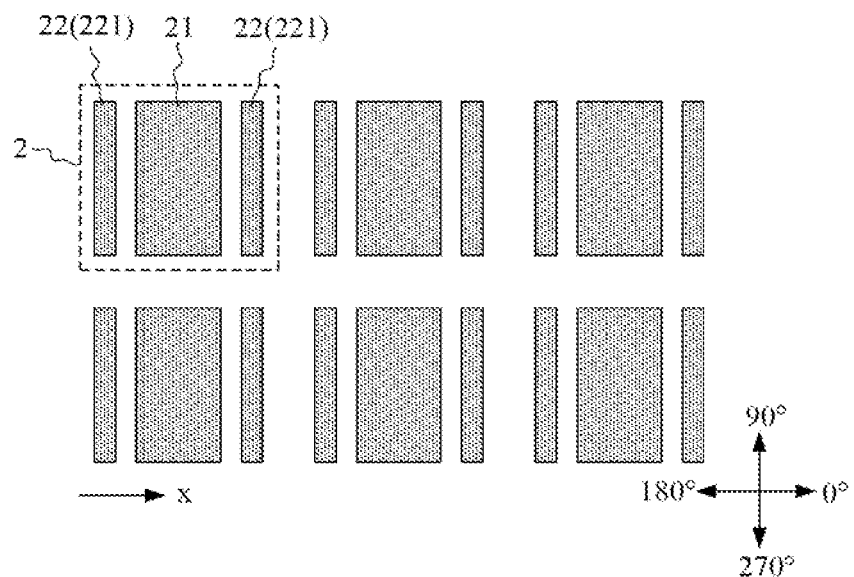
FIG. 13 is a schematic diagram showing a structure of a light-emitting element according to an embodiment of the present disclosure.

FIG. 13 is a schematic diagram showing a structure of the light-emitting element 2 according to an embodiment of the present disclosure. In some embodiments, as shown in FIG. 13, the auxiliary light-emitting element 22 includes two first auxiliary light-emitting sub-elements 221, and the two first auxiliary light-emitting sub-elements 221 are located on two sides of the primary light-emitting element 21 in the first direction x, where the first direction x is parallel to the plane of the substrate 1.

It should be noted that, as shown in FIG. 13, the "0°" corresponds to a viewing orientation when the viewer is at a right side of the display panel; the "90°" shown in FIG. 13 corresponds to a viewing orientation when the viewer is at an upper side of the display panel, for example, the display panel is placed at a low position, and the viewer looks down to view the displayed image; the "180°" corresponds to a viewing orientation when the viewer is at a left side of the display panel; and the "270°" corresponds to a viewing orientation when the viewer is at a lower side of the display panel, for example, the display panel is placed at a high position, and the viewer looks up to view the displayed image. In the embodiments of the present disclosure, the first direction x may refer to a direction corresponding to the "0°" or a direction corresponding to the "180°". In other words, there is a straight line extending along the first direction x in the plane of the display panel, and the "0°", "90°", "180°" and "270°" shown in FIG. 13 can be illustrated as an angle between this straight line and an orthographic projection of a sight line of the viewer onto the plane of the display panel.

In the sharing mode, for a display device such as a mobile phone, a computer, and the like, when other viewers view the displayed image at the same time, most of the other viewers view the displayed image at the left side or the right side of the display panel. In the embodiments of the present disclosure, the two first auxiliary light-emitting sub-elements 221 are respectively arranged on two sides of the primary light-emitting the element 21 in the first direction x. In this case, when the two first auxiliary light-emitting sub-elements 221 emit light in the sharing mode, the brightness of the display panel can be improved at a large viewing angle at the left side and the right side, thereby improving the viewer's viewing experience in the sharing mode.

Figure 14:
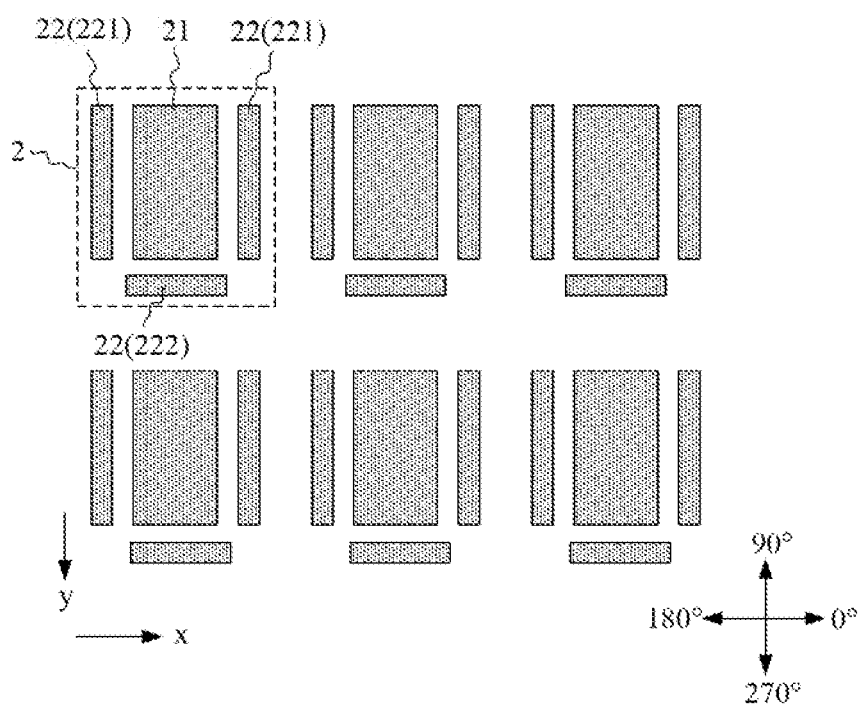
FIG. 14 is a schematic diagram showing another structure of a light-emitting element according to an embodiment of the present disclosure.

FIG. 14 is a schematic diagram showing another structure of a light-emitting element according to an embodiment of the present disclosure. Furthermore, as shown in FIG. 14, the auxiliary light-emitting element 22 further includes a second auxiliary light-emitting sub-element 222, and the second auxiliary light-emitting sub-element 222 is located at a side of the primary light-emitting the element 21 in a second direction y. The second direction y is parallel to the plane of the substrate 1, and intersects with the first direction x.

In the sharing mode, in addition to viewing the displayed image at the left side and the right side of the display panel, viewers may also view the displayed image at an upper side of the display panel. For example, the display panel is placed on a desk and the viewer is standing and viewing the displayed image of the display panel, this case can be regarded as the viewer viewing the displayed image at an upper side of the display panel. In an embodiment of the present disclosure, the second direction y may refer to a direction corresponding to 270°. That is, in a direction in the plane of the substrate 1, the second auxiliary light-emitting sub-element 222 is arranged at a lower side of the primary light-emitting the element 21. In this case, in the sharing mode, light emitted by the second auxiliary light-emitting sub-element 222 exits through the first opening 4, and the exiting direction is close to the viewing angle of 90°. Therefore, the brightness of the display panel at an upper-side viewing angle can be improved, thereby being beneficial to improving viewers' viewing experience in the sharing mode.

Figure 15:
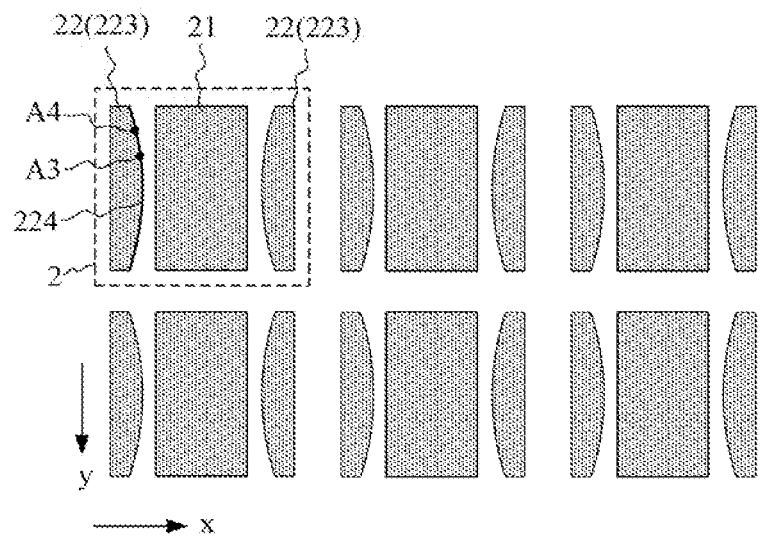
FIG. 15 is a schematic diagram showing yet another structure of a light-emitting element according to an embodiment of the present disclosure.

FIG. 15 is a schematic diagram showing yet another structure of the light-emitting element 2 according to an embodiment of the present disclosure. In some embodiments, as shown in FIG. 15, the auxiliary light-emitting element 22 includes a strip-shaped light-emitting part 223 having two ends. In a direction parallel to a third direction and from either of the two ends of the strip-shaped light-emitting part 223 to a center of the strip-shaped light-emitting part 223, a distance between the strip-shaped light-emitting part 223 and the primary light-emitting element 21 gradually decreases. The third direction is perpendicular to a direction along which the strip-shaped light-emitting part 223 and the primary light-emitting element 21 are arranged. Exemplarily, when the strip-shaped light-emitting part 223 is located at a side of the primary light-emitting element 21 in the first direction x, the third direction is the second direction y; and when the strip-shaped light-emitting part 223 is located at a side of the primary light-emitting element 21 in the second direction y, the third direction is the first direction x.

In another expression, please refer to FIG. 15, in the direction perpendicular to the plane of the substrate 1, an orthographic projection of the strip-shaped light-emitting part 223 includes a first device edge 224 close to the primary light-emitting element 21. The first device edge 224 is an arc-shaped edge and is convex in a direction towards the primary light-emitting element 21. Alternatively, in the direction perpendicular to the plane of the substrate 1, an orthographic projection of the auxiliary light-emitting element 22 includes a first device edge 224 close to the primary light-emitting element 21. The first device edge 224 includes a third point A3 and a fourth point A4, a distance between the third point A3 and the primary light-emitting element 21 is smaller than a distance between the fourth point A4 and the primary light-emitting element 21, and a minimum distance from the third point A3 to the end of the strip-shaped light-emitting part 223 is greater than a minimum distance from the fourth point A4 to the end of the strip-shaped light-emitting part 223.

When the first device edge 224 of the strip-shaped light-emitting part 223 is a straight-line edge, different positions on the first device edge 224 have a same distance to an edge of the first opening 4 at a side facing away from the strip-shaped light-emitting part 223. As a result, in the sharing mode, light emitted by different positions on the first device edge 224, when exiting through this edge of the first opening 4, have a substantially same propagation angle. Therefore, in a process the viewer moves from a position corresponding to the frontal viewing angle to a position corresponding to the large viewing angle, the brightness of the display panel suddenly decreases at a certain viewing angle, resulting in sudden changes in brightness. In the embodiments of the present disclosure, the first device edge 224 of the strip-shaped light-emitting part 223 is arranged to be an arc-shaped edge that is convex in the direction towards the primary light-emitting element 21. In a first aspect, the distance between the position of the convex part of the first device edge 224 and the edge of the first opening 4 at the side facing away from the strip-shaped light-emitting part 223 is different from the distance between the position of the non-convex part of the first device edge 224 and the edge of the first opening 4 at the side facing away from the strip-shaped light-emitting part 223. In this way, light emitted by different positions on the first device edge 224, when exiting through this edge of the first opening 4, have different propagation angles, thereby effectively weakening the sudden change of brightness at different viewing angles. In a second aspect, the convex part of the strip-shaped light-emitting part 223 is closer to the primary light-emitting element 21, that is, closer to the first opening 4, therefore, when the display panel is in the sharing mode, the light emitted by the convex part of the strip-shaped light-emitting part 223 and exiting through the first opening 4 can increase the brightness of the display panel at the large viewing-angle, thereby improving the display effect of the display panel in the sharing mode. In a third aspect, a process of forming a film with a concave edge based on the existing process technology is relatively difficult, therefore, the first device edge 224 of the strip-shaped light-emitting part 223 being formed as an arc-shaped edge that is convex in the direction towards the primary light-emitting element 21, can reduce the process difficulty of the strip-shaped light-emitting part 223. Through the design of this embodiment, a coverage area of the auxiliary light-emitting element 22 increases in a direction away from the primary light-emitting element 21 or the first opening 4, such that compensation is achieved for the brightness difference in a direction away from the first opening 4 caused by the attenuation of the amount of light emitted by the auxiliary light-emitting element 22 and passing through the first opening 4.

Figure 16:
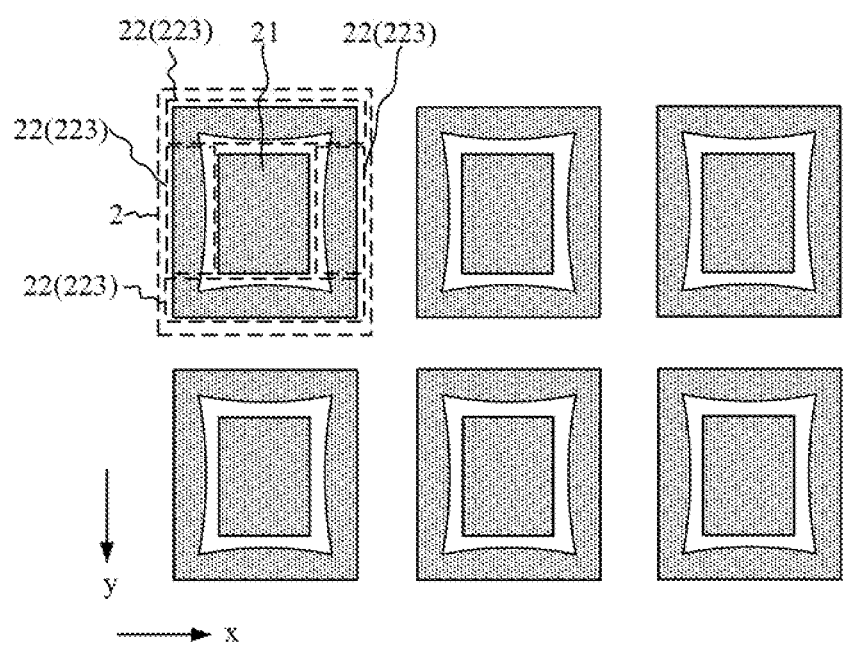
FIG. 16 is a schematic diagram showing yet another structure of a light-emitting element according to an embodiment of the present disclosure.

In addition, it should be noted that when the auxiliary light-emitting element 22 includes multiple strip-shaped light-emitting parts 223, these multiple strip-shaped light-emitting parts 223 may be independent from each other and not connected to one another. Exemplarily, as shown in FIG. 15, the auxiliary light-emitting element 22 includes two strip-shaped light-emitting parts 223, and the two strip-shaped light-emitting parts 223 are located at two opposite sides of the primary light-emitting element 21 in the first direction x, respectively. In some embodiments, at least two of the multiple strip-shaped light-emitting parts 223 may be arranged to be connected. FIG. 16 is a schematic diagram showing yet another structure of the light-emitting element 2 according to an embodiment of the present disclosure. Exemplarily, as shown in FIG. 16, the auxiliary light-emitting element 22 includes four strip-shaped light-emitting parts 223, and the four strip-shaped light-emitting parts 223 are connected end to end, so that the auxiliary light-emitting element 22 has a closed structure surrounding the primary light-emitting element 21.

In one possible implementation, please refer to FIG. 13, one edge of the auxiliary light-emitting element 22 is adjacent to one edge of the primary light-emitting element 21, and the two adjacent edges each are a straight-line edge. That is, the edge of the auxiliary light-emitting element 22 facing the primary light-emitting element 21 is a straight-line edge, the edge of the primary light-emitting element 21 facing the auxiliary light-emitting element 22 is a straight-line edge, and two opposite edges of the primary light-emitting element 21 and the auxiliary light-emitting element 22 are parallel and adjacent to each other.

When the auxiliary light-emitting element 22 is located at a periphery of the primary light-emitting element 21, in order to improve the uniformity of the brightness of the display panel when viewed from different viewing angles in the sharing mode, the auxiliary light-emitting element 22 may have a same distance to primary light-emitting element 21. However, a process of forming a film with a concave edge based on the existing process technology is relatively difficult. Therefore, compared to a configuration in which one of two opposite edges of the primary light-emitting element 21 and the auxiliary light-emitting element 22 is set to be a convex edge and the other one of the two opposite edges of the primary light-emitting element 21 and the auxiliary light-emitting element 22 is set to be a concave edge, the two edges of the primary light-emitting element 21 and the auxiliary light-emitting element 22 are set to be straight-line edges in the embodiments of the present disclosure, such that the two edges are easily set to be parallel, and the uniformity of the distance between the primary light-emitting element 21 and the auxiliary light-emitting element 22 is easier to realize.

Figure 17:
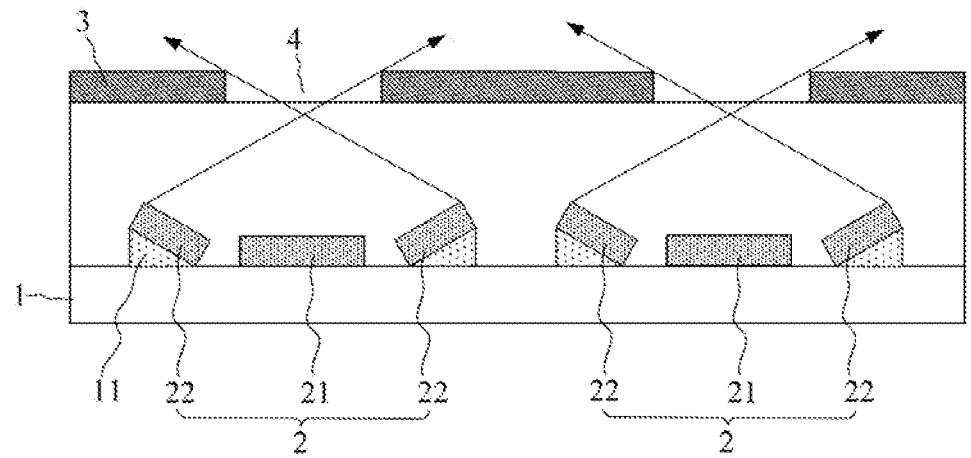
FIG. 17 is a schematic diagram showing yet another structure of a light-emitting element according to an embodiment of the present disclosure.

FIG. 17 is a schematic diagram showing yet another structure of a light-emitting element 2 according to an embodiment of the present disclosure. In some embodiments, as shown in FIG. 17, in a direction from the auxiliary light-emitting element 22 to the primary light-emitting element 21, the auxiliary light-emitting element 22 inclines in a direction towards a light-exiting plane of the display panel. In other words, in the direction from the primary light-emitting element 21 to the auxiliary light-emitting element 22, the spacing between the auxiliary light-emitting element 22 and the substrate 1 gradually increases.

When two adjacent light-emitting elements 2 are configured to emit light of different colors, the light emitted obliquely from the auxiliary light-emitting element 22 in one of the two adjacent light-emitting elements 2 may pass through the first opening 4 of the adjacent light-emitting element 2, causing crosstalk of light of different colors. For avoiding this, in the embodiments of the present disclosure, by arranging the auxiliary light-emitting element 22 obliquely, the oblique light emitted by the auxiliary light-emitting element 22 can more likely pass through the first opening 4 corresponding to the light-emitting element 2 where the auxiliary light-emitting element 22 is located, thereby reducing the crosstalk phenomenon.

In addition, please refer to FIG. 17, it should be noted that the display panel may further include a pad layer 11. The pad layer 11 is located between the auxiliary light-emitting element 22 and the substrate 1. A surface of the pad layer 11 facing away from the substrate 1 is an inclined surface, so as to achieve the inclined arrangement of the auxiliary light-emitting element 22.

Figure 18:
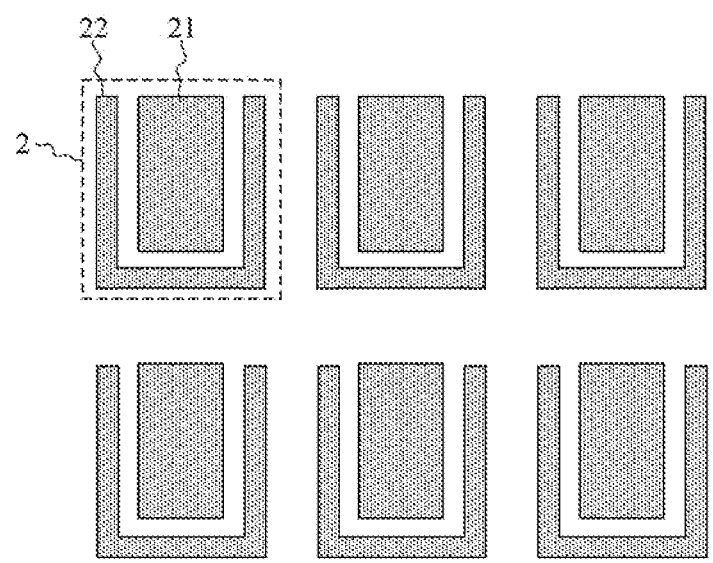
FIG. 18 is a schematic diagram showing yet another structure of a light-emitting element according to an embodiment of the present disclosure.
Figure 19:
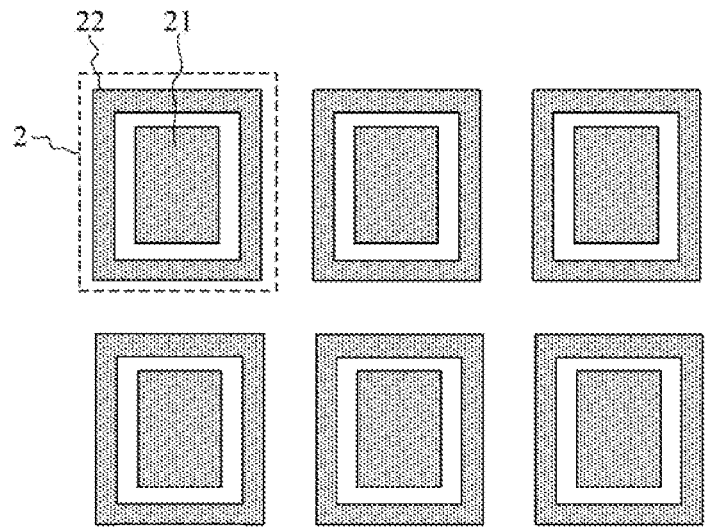
FIG. 19 is a schematic diagram showing yet another structure of a light-emitting element according to an embodiment of the present disclosure.
Figure 20:
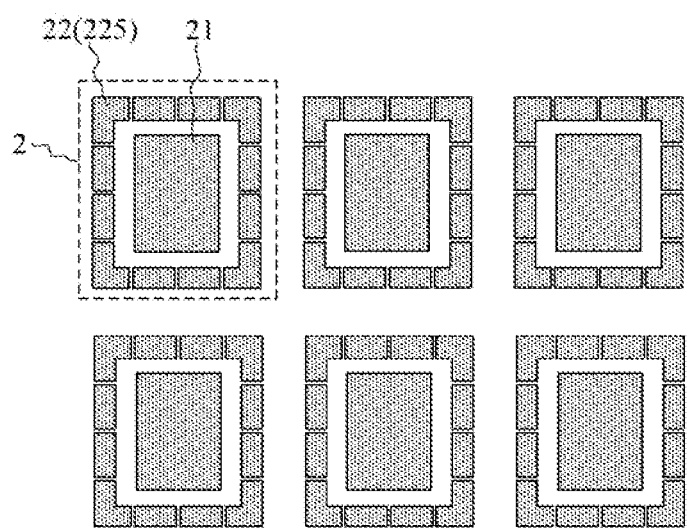
FIG. 20 is a schematic diagram showing yet another structure of a light-emitting element according to an embodiment of the present disclosure.

FIG. 18 is a schematic diagram showing yet another structure of a light-emitting element 2 according to an embodiment of the present disclosure. FIG. 19 is a schematic diagram showing yet another structure of a light-emitting element 2 according to an embodiment of the present disclosure. FIG. 20 is a schematic diagram showing yet another structure of a light-emitting element 2 according to an embodiment of the present disclosure. In some embodiments, as shown in FIG. 18 to FIG. 20, the auxiliary light-emitting element 22 surrounds the primary light-emitting element 21.

In a configuration, please refer to FIG. 18, the primary light-emitting element 21 may be partially surrounded by the auxiliary light-emitting element 22, that is, the auxiliary light-emitting element 22 is formed as a semi-closed pattern. In this structure, the auxiliary light-emitting element 22 may be located at at least one of sides of the primary light-emitting element 21 in the first direction x and sides of the primary light-emitting element 21 in the second direction y. Combined with the above analysis, such configuration can effectively improve the brightness of the display panel when viewed at an upper viewing angle, a left viewing angle and a right viewing angle.

Alternatively, in another configuration, please refer to FIG. 19 and FIG. 20, the auxiliary light-emitting element 22 may surround the primary light-emitting element 21. In this case, the auxiliary light-emitting element 22 may be formed as a closed pattern as shown in FIG. 19, or the auxiliary light-emitting element 22 may include a plurality of auxiliary light-emitting sub-elements 225 arranged at intervals as shown in FIG. 20, and the plurality of auxiliary light-emitting sub-elements 225 surround the primary light-emitting element 21. In such configuration, the auxiliary light-emitting element 22 surrounds the primary light-emitting element 21 in all directions. In the sharing mode, the auxiliary light-emitting element 22 increases the viewable angle range in all directions and is beneficial to improving the uniformity of the brightness of the display panel at various viewing angles.

Figure 21:
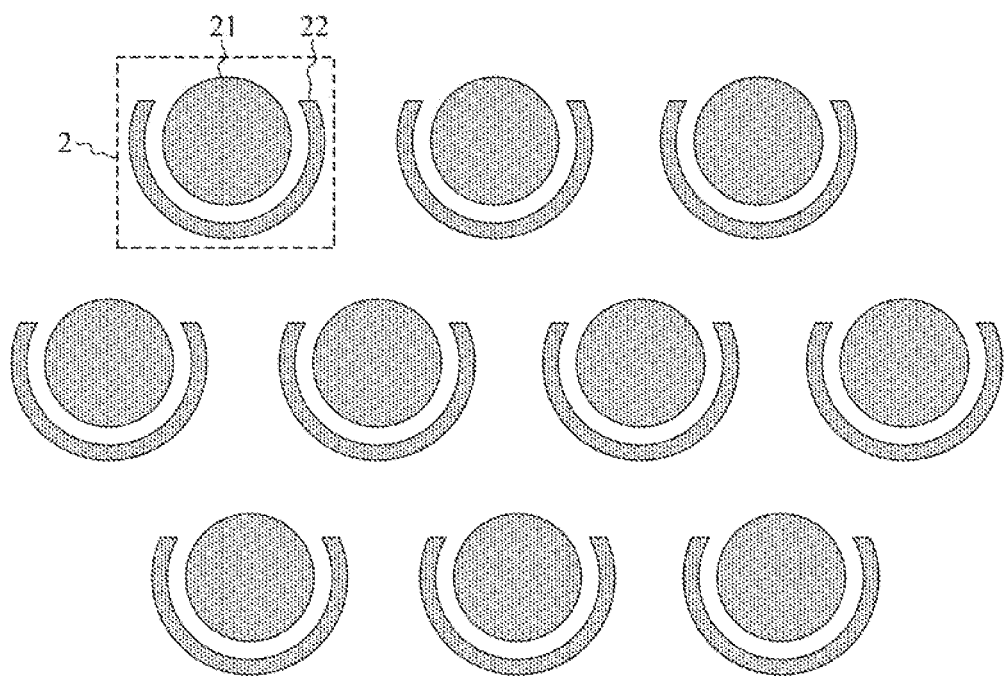
FIG. 21 is a schematic diagram showing yet another structure of a light-emitting element according to an embodiment of the present disclosure.
Figure 22:
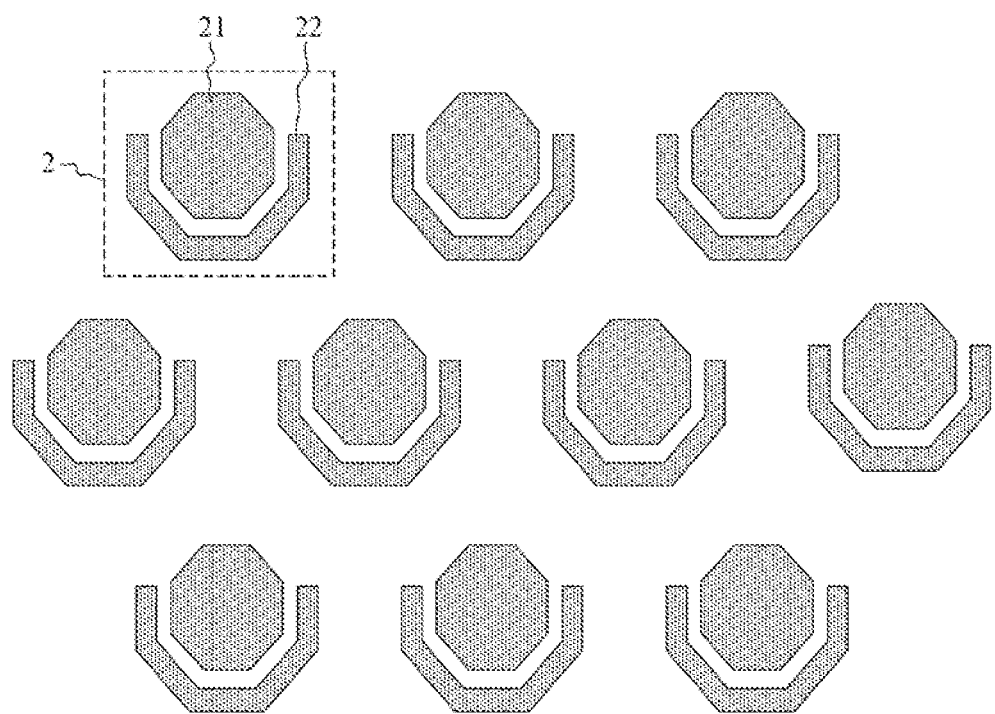
FIG. 22 is a schematic diagram showing yet another structure of a light-emitting element according to an embodiment of the present disclosure.

FIG. 21 is a schematic diagram showing yet another structure of a light-emitting element 2 according to an embodiment of the present disclosure. FIG. 22 is a schematic diagram showing yet another structure of a light-emitting element 2 according to an embodiment of the present disclosure. In some embodiments, as shown in FIG. 21 and FIG. 22, in the direction perpendicular to the plane of the substrate 1, a shape of an orthographic projection of the primary light-emitting element 21 is one of a circle, an ellipse or a circle-like polygon.

When the shape of the primary light-emitting element 21 is designed to a circle, an ellipse or a circle-like polygon, on the one hand, when ambient light enters the display panel through the first opening 4 and is reflected to the human eye, the diffraction fringes generated by the reflected light are likely circular fringes, which can weaken the diffraction phenomenon and avoid the star burst phenomenon; and on the other hand, if the primary light-emitting element 21 is in an elongated rectangular shape, a length of a diagonal of the primary light-emitting element 21 will be significantly larger than the length of a short edge of the primary light-emitting element 21, so the light emitted by the primary light-emitting element 21 will be significantly different in terms of an amount of light passing through the first opening 4 at different angles, which will lead to an obvious difference in terms of brightness when the display panel is viewed at different viewing angles. By designing the primary light-emitting element 21 to be a circle or a structure similar to a circle, each edge and each diagonal of the primary light-emitting element 21 are substantially equal in length, so the brightness of the display panel when viewed at different viewing angles is substantially the same, which can effectively improve the brightness uniformity of the display panel when viewed at different viewing angles.

In addition, it should be noted that when the primary light-emitting element 21 adopts the design described above, the auxiliary light-emitting element 22 can surround the primary light-emitting element 21 along the edges of the primary light-emitting element 21, so as to better realize the consistency of the spacing distance between the auxiliary light-emitting element 22 and the primary light-emitting element 21.

Figure 23:
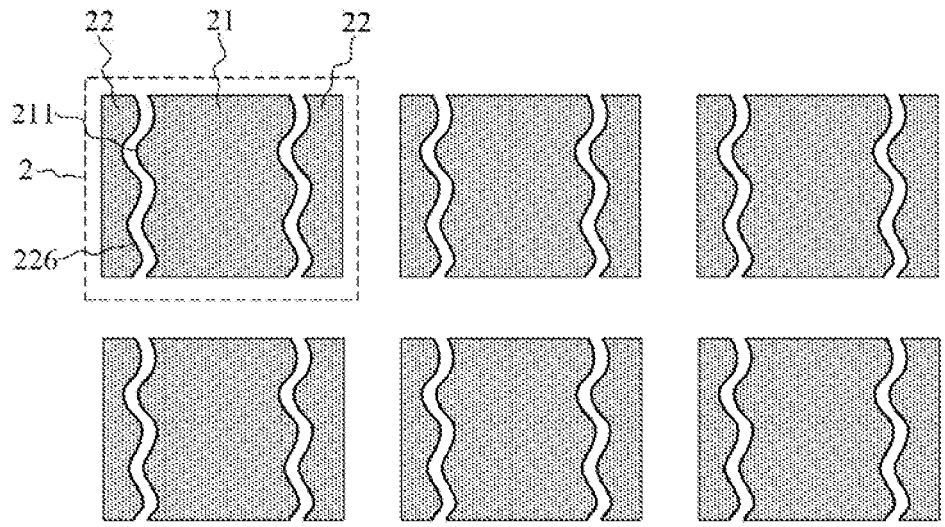
FIG. 23 is a schematic diagram showing yet another structure of a light-emitting element according to an embodiment of the present disclosure.
Figure 24:
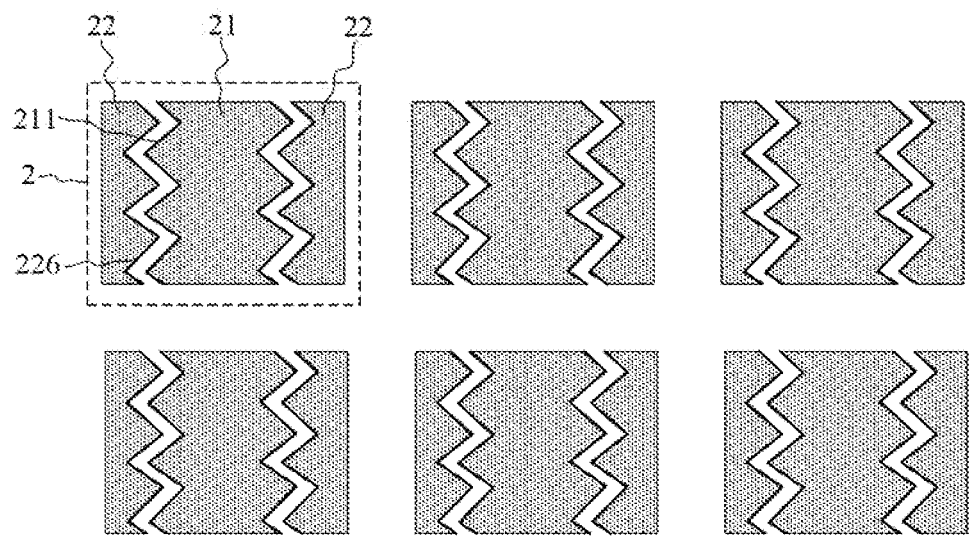
FIG. 24 is a schematic diagram showing yet another structure of a light-emitting element according to an embodiment of the present disclosure.

FIG. 23 is a schematic diagram showing yet another structure of a light-emitting element 2 according to an embodiment of the present disclosure. FIG. 24 is a schematic diagram showing yet another structure of a light-emitting element 2 according to an embodiment of the present disclosure. In some embodiments, as shown in FIG. 23 and FIG. 24, an edge of the primary light-emitting element 21 close to the auxiliary light-emitting element 22 has a first convex-concave structure 211, and an edge of the auxiliary light-emitting element 22 close to the primary light-emitting element 21 is provided with a second convex-concave structure 226. A concave part of the first convex-concave structure 211 surrounds a convex part of the second convex-concave structure 226, and a concave part of the second convex-concave structure 226 surrounds a convex part of the first convex-concave structure 211. That is, the opposite edges of the primary light-emitting element 21 and the auxiliary light-emitting element 22 mesh with each other.

In a configuration, as shown in FIG. 23, both the opposite edges of the primary light-emitting element 21 and the auxiliary light-emitting element 22 can be wave-shaped edges. Or, in another configuration, as shown in FIG. 24, both the opposite edges of the primary light-emitting element 21 and the auxiliary light-emitting element 22 can be folded-line edges.

If the edge of the primary light-emitting element 21 is a straight-line edge, the light emitted from the edge of the primary light-emitting element 21 has a great influence on the brightness at different viewing angles. For example, when the view angle of the display panel is changed from the frontal viewing angle to an oblique viewing angle, the phenomenon of sudden change of brightness may occur. By arranging the edge of the primary light-emitting element 21 to have a convex-concave structure, the light emitted from different positions of the convex-concave edge of the primary light-emitting element 21 have different propagation directions, which can weaken the sudden change of brightness at different viewing angles. Furthermore, the edge of the auxiliary light-emitting element 22 also has a convex-concave structure, and the edges of the primary light-emitting element 21 and the auxiliary light-emitting element 22 mesh with each other. In the sharing mode, the light emitted from the concave part of the primary light-emitting element 21 can be compensated by the light emitted from the convex part of the auxiliary light-emitting element 22, thereby further improving the brightness uniformity of the display panel at different viewing angles.

Figure 25:
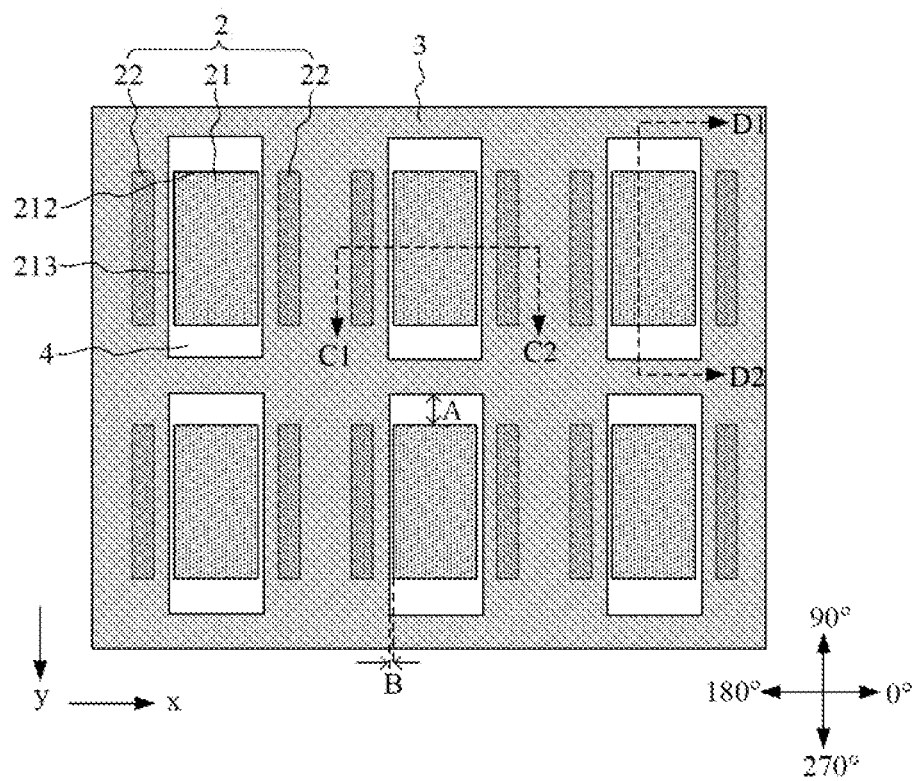
FIG. 25 is a schematic diagram showing a structure of a first opening according to an embodiment of the present disclosure.
Figure 26:
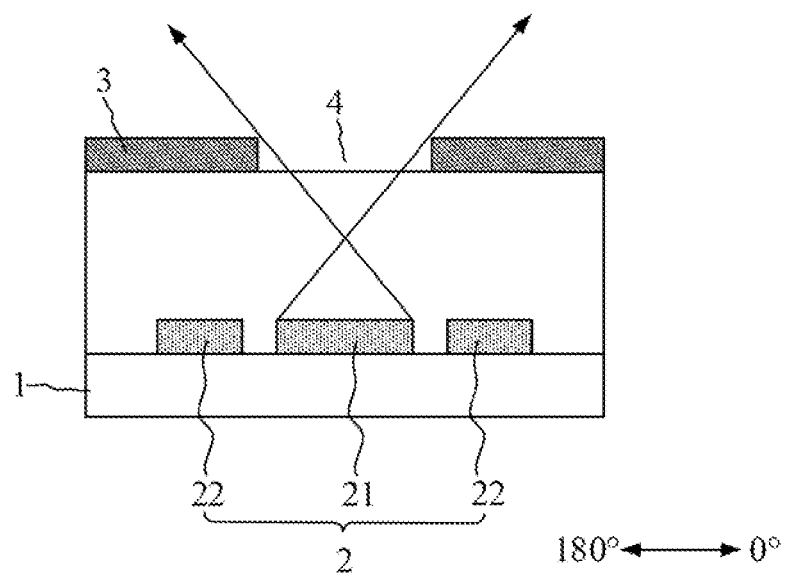
FIG. 26 is a cross-sectional view of FIG. 25 taken along C1-C2.
Figure 27:
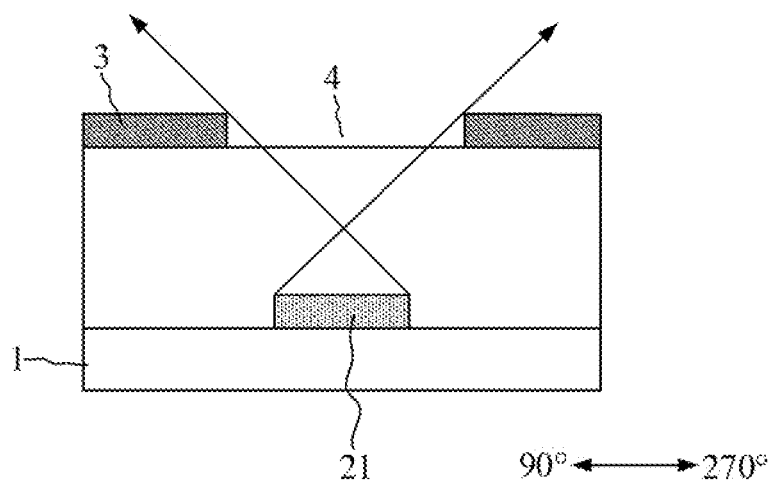
FIG. 27 is a cross-sectional view of FIG. 25 taken along D1-D2.

FIG. 25 is a schematic diagram showing a structure of a first opening 4 according to an embodiment of the present disclosure. FIG. 26 is a cross-sectional view of FIG. 25 taken along C1-C2. FIG. 27 is a cross-sectional view of FIG. 25 taken along D1-D2. In some embodiments, as shown in FIG. 25 to FIG. 27, in the direction perpendicular to the plane of the substrate 1, an orthographic projection of the primary light-emitting element 21 includes a first edge 212 extending in the first direction x and a second edge 213 extending in the second direction y. Both the first direction x and the second direction y are parallel to the plane of the substrate 1, and the first direction x intersects with the second direction y. A distance A between the first edge 212 and an edge of the first opening 4 adjacent to the first edge 212 in the second direction y is and a distance B between the second edge 213 and an edge of the first opening 4 adjacent to the second edge 213 in the first direction x satisfy: B<A.

As described above, the first direction x may refer to the direction corresponding to 0° or 180°. In the anti-peering mode, in most cases, it is to prevent people at the left and right sides of the display panel from seeing the displayed image. Therefore, in conjunction with FIG. 26 and FIG. 27, by reducing the distance B between the second edge 213 and the edge of the first opening 4 adjacent to the second edge 213, an amount of the light that is emitted from the primary light-emitting element 21 corresponding to the second edge 213 and exits through the first opening 4 can be reduced, thereby further narrowing the viewing angle range between 0°~180° (left and right sides), and improving the privacy protection effect.

Figure 28:
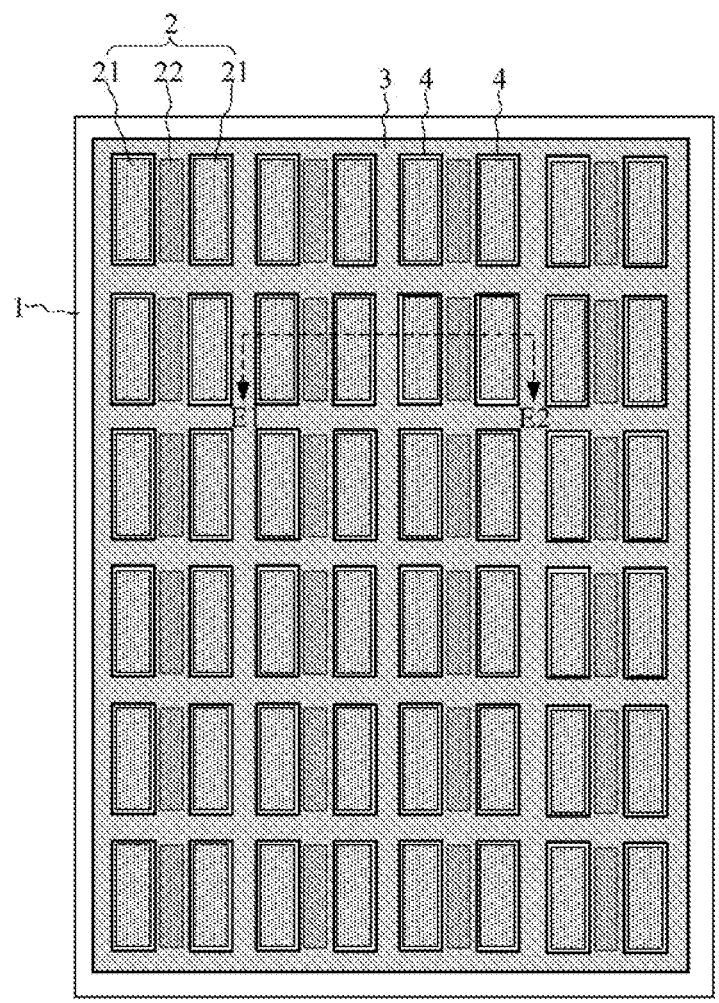
FIG. 28 is a schematic diagram showing a structure of another display panel according to an embodiment of the present disclosure.
Figure 29:
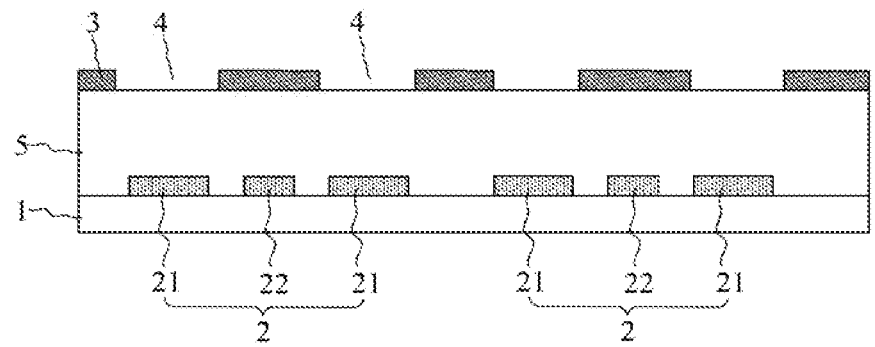
FIG. 29 is a cross-sectional view of FIG. 28 taken along E1-E2.

FIG. 28 is a schematic diagram showing a structure of another display panel according to an embodiment of the present disclosure. FIG. 29 is a cross-sectional view of FIG. 28 taken along E1-E2. In a possible implantation, as shown in FIG. 28 and FIG. 29, the light-emitting element 2 includes at least two primary light-emitting elements 21, and a auxiliary light-emitting elements 22 located between and spaced from any two of the at least two primary light-emitting element 21.

Figure 30:
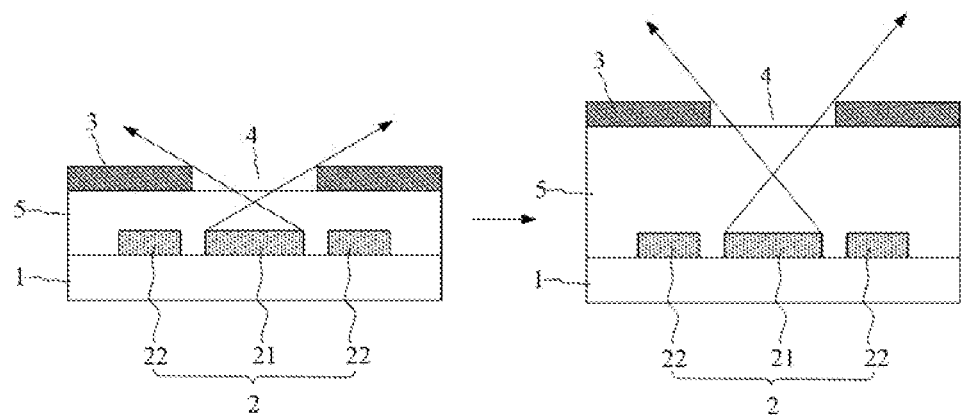
FIG. 30 is a schematic diagram showing light propagation according to an embodiment of the present disclosure.

If one light-emitting element 2 with a larger area includes only one primary light-emitting element 21, an area of the first opening 4 corresponding to the primary light-emitting element 21 also needs to be set larger. FIG. 30 is a schematic diagram showing light propagation according to an embodiment of the present disclosure. As shown in FIG. 30, if a distance between the light-shielding layer 3 and the light-emitting element 2 is relatively small, in the anti-peering mode, the light emitted from the edge of the primary light-emitting element 21 travels in a direction corresponding to a large viewing angle when exiting through the edge of the first opening 4, so that the display panel has a large viewable angel range, resulting in a poor anti-peering effect. However, if a distance between the light-shielding layer 3 and the light-emitting element 2 is increased to narrow the viewable angel range, a thickness of the function layer 5 between the light-shielding layer 3 and the light-emitting element 2 needs to be set excessively large, as a result, the propagation of the light emitted by the primary light-emitting element 21 will have a large loss in the function layer 5, thereby affecting the light-emitting brightness.

Figure 31:
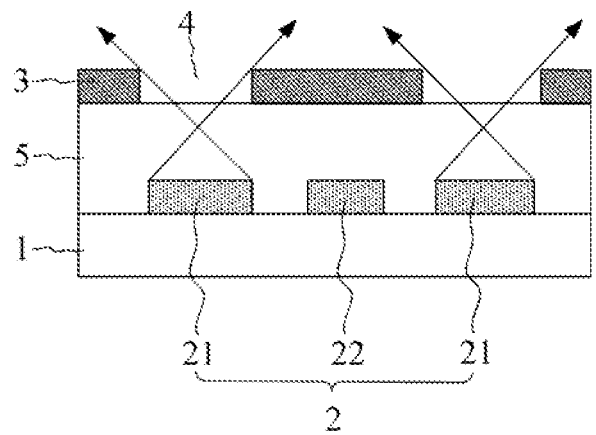
FIG. 31 is a schematic diagram showing another light propagation according to an embodiment of the present disclosure.

In the embodiments of the present disclosure, the light-emitting element 2 includes a plurality of primary light-emitting elements 21, and an auxiliary light-emitting element 22 is located between and spaced from the plurality of primary light-emitting elements 21 to space the light-emitting elements 21 from each other. In this way, an area of each of the plurality of primary light-emitting elements 21 can be reduced, thus an area of the corresponding first opening for each primary light-emitting element 21 can be reduced accordingly. FIG. 31 is a schematic diagram showing another light propagation according to an embodiment of the present disclosure. As shown in FIG. 31, the display panel has a narrow viewable angle range in the anti-peering mode without increasing the spacing between the light-shielding layer 3 and the light-emitting element 2, such that the viewable angle range is narrowed, and the anti-peering effect is improved. In other words, since the spacing between the light-shielding layer 3 and the light-emitting element 2 does not need to be set too large in this configuration, the light loss in the function layer 5 can be reduced, the luminous efficiency is improved, and the light-emitting brightness of the light-emitting element 2 is further improved.

With the configuration that any two primary light-emitting units 21 are spaced apart by the auxiliary light-emitting unit 22, at least two primary light-emitting units 21 are dispersedly arranged in the region of the light-emitting element 2, thereby avoiding a situation that a partial region of the light-emitting element 2 is too bright and another partial region of the light-emitting element 2 is too dark in the anti-peering mode and thus improving the brightness uniformity. In addition, in the sharing mode, the light emitted from the auxiliary light-emitting element 22 can exit through the first openings 4 corresponding to at least two primary light-emitting elements 21, thereby improving the display uniformity at different viewing angles in the sharing mode.

Figure 32:
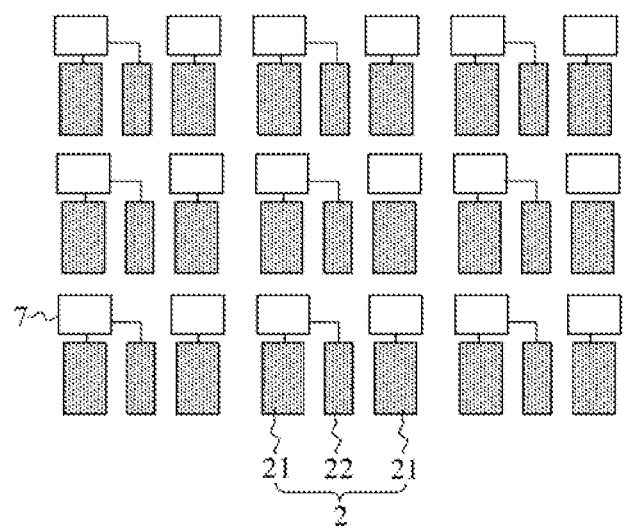
FIG. 32 is a partial top view of a display panel according to an embodiment of the present disclosure.
Figure 33:
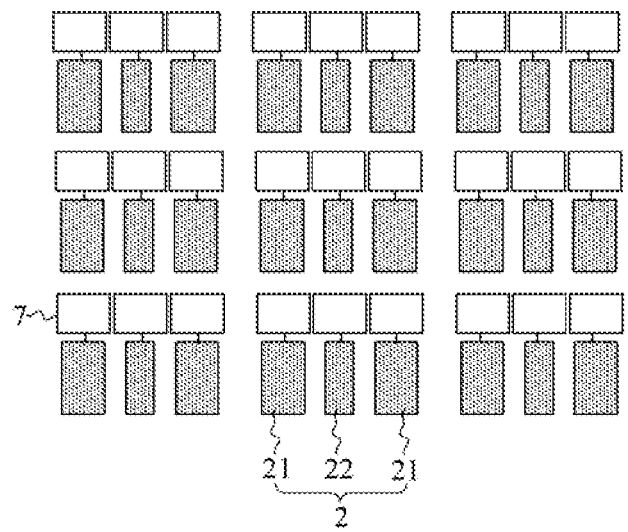
FIG. 33 is another partial top view of a display panel according to an embodiment of the present disclosure.

FIG. 32 is a partial top view of a display panel according to an embodiment of the present disclosure. FIG. 33 is another partial top view of a display panel according to an embodiment of the present disclosure. As shown in FIG. 32 and FIG. 33, the display panel further includes pixel driving circuits 7, and at least two primary light-emitting units 21 are electrically connected to at least two pixel driving circuits 7 in one-to-one correspondence.

As shown in FIG. 32, the auxiliary light-emitting element 22 may share the pixel driving circuit 7 with one of the at least two primary light-emitting units 21. With this confirmation, in the sharing mode, the auxiliary light-emitting element 22 and one of the primary light-emitting units 21 receive a driving current provided by a same pixel driving circuit 7, and thus the brightness of the primary light-emitting units 21 is the same as the brightness of the one of the auxiliary light-emitting elements 22. With this configuration, it is not necessary to provide an additional pixel driving circuit 7 for the auxiliary light-emitting element 22, thereby reducing the number of pixel driving circuits 7 that need to be provided in the display panel.

Alternatively, as shown in FIG. 33, the auxiliary light-emitting element 22 may be electrically connected to a dedicated pixel driving circuit 7. With this confirmation, in the sharing mode, the driving currents provided by different pixel driving circuits 7 to the primary light-emitting unit 21 or the auxiliary light-emitting element 22 electrically connected thereto may be the same or different, thereby improving the flexibility of setting the light-emitting brightness of different primary light-emitting elements 21.

Figure 34:
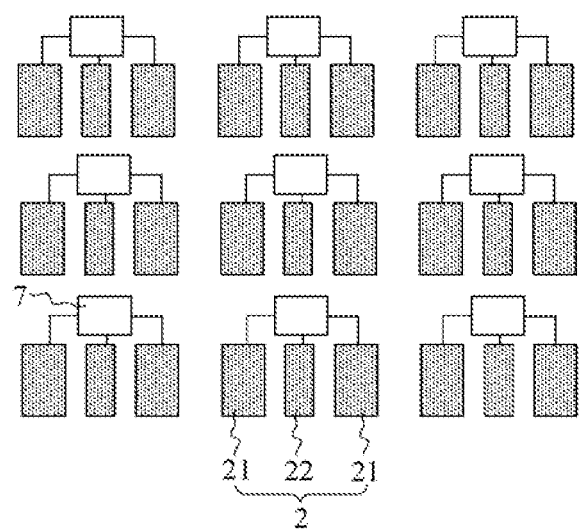
FIG. 34 is yet another partial top view of a display panel according to an embodiment of the present disclosure.

FIG. 34 is yet another partial top view of a display panel according to an embodiment of the present disclosure. As shown in FIG. 34, in one embodiment, the display panel further includes a pixel driving circuit 7, and at least two primary light-emitting elements 21 are electrically connected to a same pixel driving circuit 7. In this case, at least two primary light-emitting elements 21 share one pixel driving circuit 7, thereby greatly reducing the number of pixel driving circuits 7 required in the display panel, and thus being beneficial to increasing the pixel density. With this configuration, the auxiliary light-emitting element 22 may be also electrically connected to this pixel driving circuit 7, and accordingly, the primary light-emitting element 21 and the auxiliary light-emitting element 22 of the light-emitting element 2 share one pixel driving circuit 7.

It should be noted that the configuration that the light-emitting element 2 includes at least two primary light-emitting elements 21 can also be illustrated as that an original primary light-emitting element 21 with a large area of the light-emitting element 2 is divided into a plurality of light-emitting sub-elements dispersedly arranged and each with a smaller area.

Figure 35:
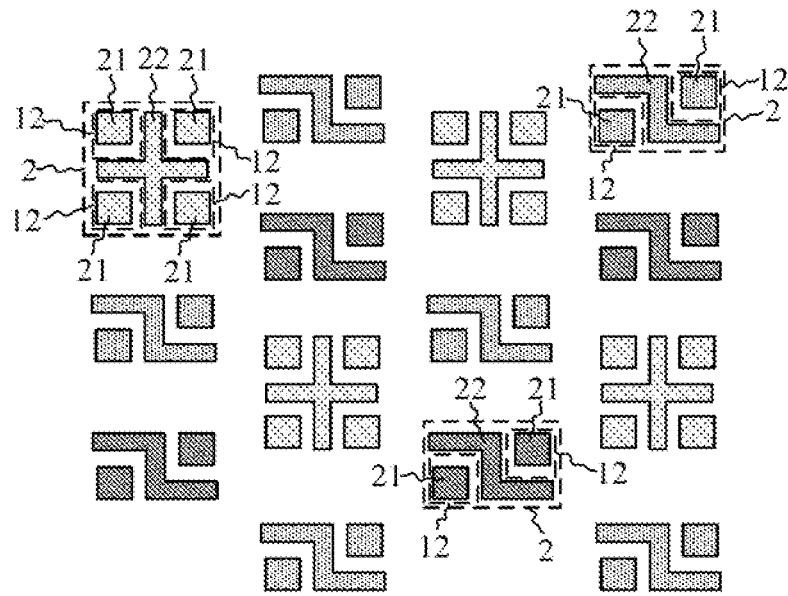
FIG. 35 is a schematic diagram showing an arrangement of a primary light-emitting element and an auxiliary light-emitting element according to an embodiment of the present disclosure.
Figure 36:
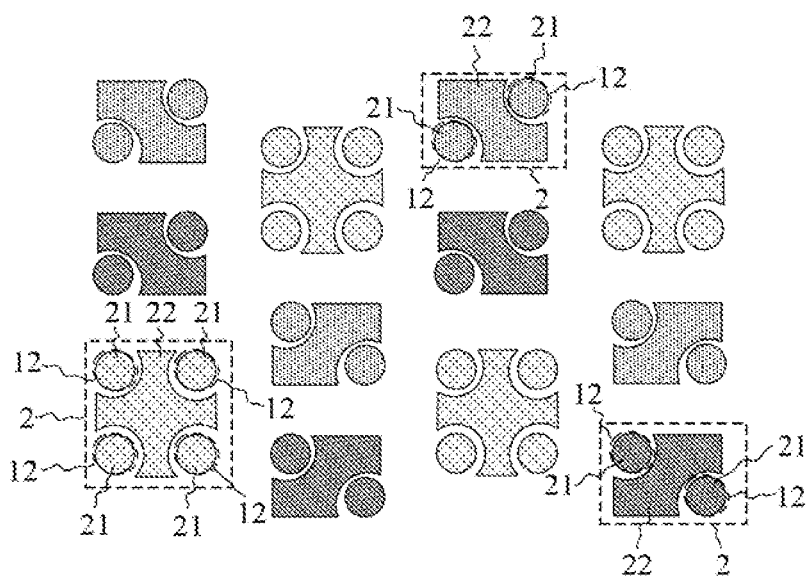
FIG. 36 is a schematic diagram showing another arrangement of a primary light-emitting element and an auxiliary light-emitting element according to an embodiment of the present disclosure.

FIG. 35 is a schematic diagram showing an arrangement of a primary light-emitting element 21 and an auxiliary light-emitting element 22 according to an embodiment of the present disclosure. FIG. 36 is a schematic diagram showing another arrangement of a primary light-emitting element 21 and an auxiliary light-emitting element 22 according to an embodiment of the present disclosure. In an embodiment, as shown in FIG. 35 and FIG. 36, the auxiliary light-emitting element 22 includes at least two notches 12 that are in one-to-one correspondence with at least two primary light-emitting elements 21, and at least part of the at least two primary light-emitting elements 21 are located in the at least two notches 12.

In this embodiment, by arranging at least part of the primary light-emitting elements 21 in the notches of the auxiliary light-emitting elements 22, the primary light-emitting elements 21 and the auxiliary light-emitting elements 22 can be compactly arranged. In the sharing mode, the primary light-emitting element 21 and the auxiliary light-emitting element 22 emit light simultaneously, the brightness uniformity of the display panel at different viewing angles can be improved, thereby avoiding significant difference in the brightness uniformity of the display panel at different viewing angles. In addition, the primary light-emitting element 21 and the auxiliary light-emitting element 22 of the light-emitting element 2 are compactly arranged, and the primary light-emitting element 21 is far away from an adjacent light-emitting element 2, thereby reducing the crosstalk between adjacent light-emitting elements 2 and thus avoiding color cast.

It should be noted that the shape of the notch 12 of the auxiliary light-emitting element 22 is associated with the shape of the primary light-emitting element 21. Exemplarily, the shape of the primary light-emitting element 21 and the shape of the notch 12 may each be a square as shown in FIG. 34, or the shape of the primary light-emitting element 21 and the shape of the notch 12 may each be a circular as shown in FIG. 35.

Figure 37:
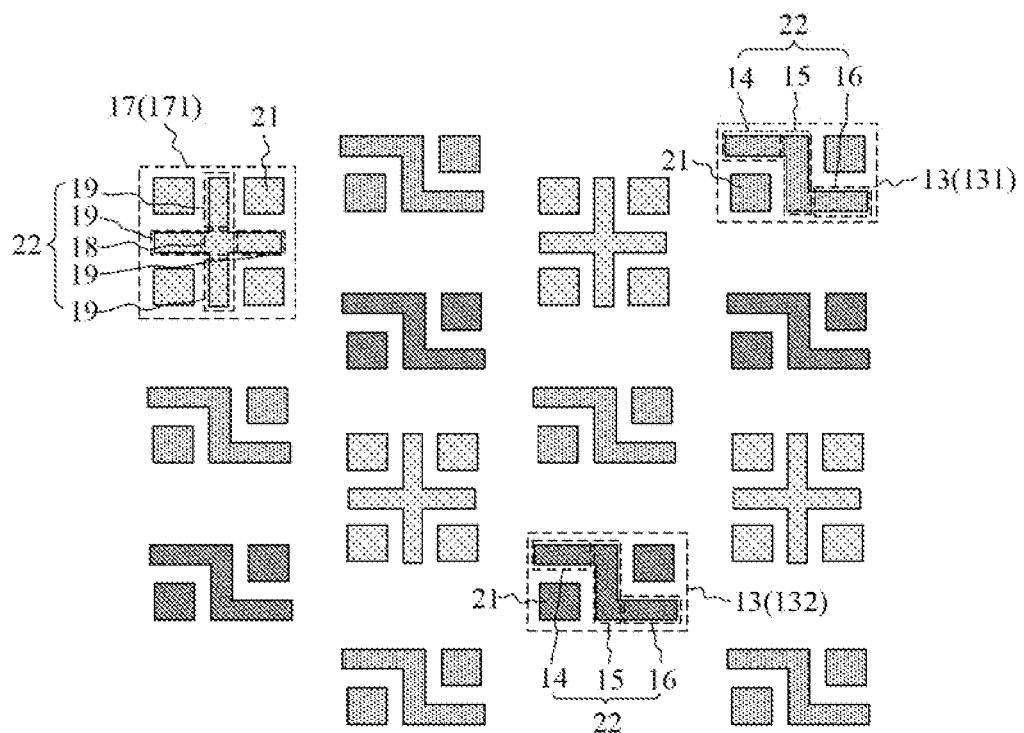
FIG. 37 is a schematic diagram showing a structure of a first light-emitting element and a second light-emitting element according to an embodiment of the present disclosure.

FIG. 37 is a schematic diagram showing a structure of a first light-emitting element 13 and a second light-emitting element 17 according to an embodiment of the present disclosure. In an embodiment, as shown in FIG. 37, the light-emitting elements 2 include a first light-emitting element 13, and the first light-emitting element 13 includes two primary light-emitting elements 21. The auxiliary light-emitting element 22 of the first light-emitting element 13 has a zigzag structure and includes a first auxiliary light-emitting part 14, a second auxiliary light-emitting part 15, and a third auxiliary light-emitting part 16, that are connected sequentially. Two primary light-emitting elements 21 of the first light-emitting element 13 are located at two sides of the second auxiliary light-emitting part 15.

Additionally/alternatively, the light-emitting elements 2 include a second light-emitting element 17, and the second light-emitting element 17 includes four primary light-emitting elements 21. The auxiliary light-emitting element 22 of the second light-emitting element 17 has a cross-shaped structure and includes a center part 18 and four branch parts 19 each connected to the center part 18. Every two adjacent branch parts 19 of the four branch parts 19 are spaced by one of the four primary light-emitting elements 21.

In this embodiment, the multiple primary light-emitting elements 21 of either the first light-emitting element 13 or the second light-emitting element 17 are dispersedly distributed in the region of the light-emitting element 2. With such configuration, the brightness uniformity of different regions in the anti-peering mode can be improved, thereby avoiding a situation that a partial region is too bright and another partial region is too dark is avoided. Furthermore, in the sharing mode, the light emitted from the auxiliary light-emitting element 22 can exit through the corresponding first openings 4 of the multiple primary light-emitting elements 21, thereby improving the display uniformity at different viewing angles.

It should be noted that the two primary light-emitting elements 21 of the first light-emitting element 13 can be regarded as two light-emitting sub-elements with small areas that are obtained by dividing an original primary light-emitting element 21 with a large area and are dispersedly arranged. Similarly, the four primary light-emitting elements 21 of the second light-emitting element 17 can be regarded as four light-emitting sub-elements with small areas that are obtained by dividing an original primary light-emitting element 21 with a large area and are dispersedly arranged. In the embodiments of the present disclosure, the area of the primary light-emitting element 21 of the first light-emitting element 13 and the second light-emitting element 17 may be the same or different.

Furthermore, please refer to FIG. 37, the first light-emitting elements 13 include a red light-emitting element 131 and a green light-emitting element 132, and the second light-emitting elements 17 include a blue light-emitting element 171. That is, for the red light-emitting element 131 and the green light-emitting element 132, the auxiliary light-emitting element 22 has a zigzag structure, and the two primary light-emitting elements 21 are located at two sides of the second auxiliary light-emitting part 15 of the auxiliary light-emitting element 22; and for the blue light-emitting element 171, the auxiliary light-emitting element 22 as a cross-shaped structure, and each of the four primary light-emitting elements 21 is located between two adjacent branch parts 19 of the auxiliary light-emitting element 22.

It can be understood that the aging rates of the red light-emitting element 131, the green light-emitting element 132 and the blue light-emitting element 171 are different due to the characteristics of the light-emitting materials. In order to improve the life uniformity, the area of the blue light-emitting element 171 can be set to be larger than the area of the red light-emitting element 131 and the area of the green light-emitting element 132. Correspondingly, a total area of the primary light-emitting elements 21 of the blue light-emitting element 171 is larger. With such configuration, the blue light-emitting element 171 can include a larger number of primary light-emitting elements 21 (it can also be understood as dividing an original primary light-emitting element 21 into a larger number of light-emitting sub-elements), so the area of a single primary light-emitting element 21 is not too large. In this way, the blue light-emitting element 171 has a smaller light-exiting angle in the anti-peering mode without increasing the spacing between the light-shielding layer 3 and the blue light-emitting element 171. Accordingly, there is no need to increase the thickness of the layer between the light-shielding layer 3 and the blue light-emitting element 171, and the loss of the light that is emitted by the blue light-emitting element 171 can be reduced.

Figure 38:
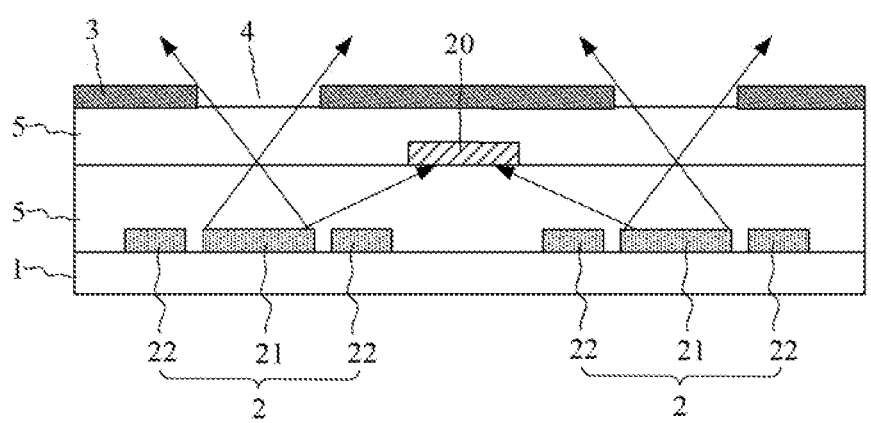
FIG. 38 is a schematic diagram showing a structure of an auxiliary light-shielding layer according to an embodiment of the present disclosure.
Figure 39:
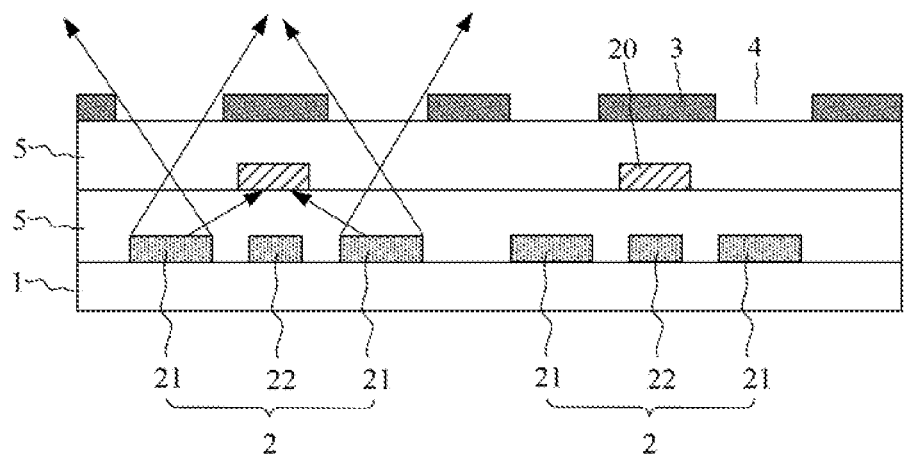
FIG. 39 is a schematic diagram showing another structure of an auxiliary light-shielding layer according to an embodiment of the present disclosure.

FIG. 38 is a schematic diagram showing a structure of an auxiliary light-shielding layer 20 according to an embodiment of the present disclosure. FIG. 39 is a schematic diagram showing another structure of an auxiliary light-shielding layer 20 according to an embodiment of the present disclosure. In an embodiment, as shown in FIG. 38 and FIG. 39, the display panel further includes an auxiliary light-shielding layer 20, and the auxiliary light-shielding layer 20 is located between the light-shielding layer 3 and the light-emitting element 2. In the direction perpendicular to the plane of the substrate 1, the light-shielding layer 3 covers the auxiliary light-shielding layer 20.

In the direction perpendicular to the plane of the substrate 1, the auxiliary light-shielding layer 20 may be located between two adjacent first openings 4 and overlap with the auxiliary light-emitting element 22. In addition, the display panel may further include a support structure provided between the light-emitting element 2 and the light-shielding layer 3, and the support structure may be formed of a light-shielding material, and then the support structure is reused as the auxiliary light-shielding layer 20.

In the above-described structure in which the auxiliary light-shielding layer 20 is provided between the light-shielding layer 3 and the light-emitting element 2, part of the light that is emitted by the primary light-emitting element 21 and travels obliquely may be blocked by the auxiliary light-shielding layer 20, such that the light emitted by the primary light-emitting element 21 exits only through the first opening 4 corresponding to the primary light-emitting element 21. As shown in FIG. 38, if the light-emitting element 2 includes one primary light-emitting element 21, the light of the one primary light-emitting element 21 can be prevented from exiting the display panel through the first opening 4 corresponding to the adjacent light-emitting element 2, thereby avoiding crosstalk and color cast. As shown in FIG. 39, if the light-emitting element 2 includes at least two primary light-emitting elements 21, for each single light-emitting element 2, the light emitted by each primary light-emitting element 21 exits the display panel through the first opening 4 corresponding to the each primary light-emitting element 21, thereby preventing from passing through the first opening 4 corresponding to other primary light-emitting element 21, and thus improving the brightness uniformity.

Figure 40:
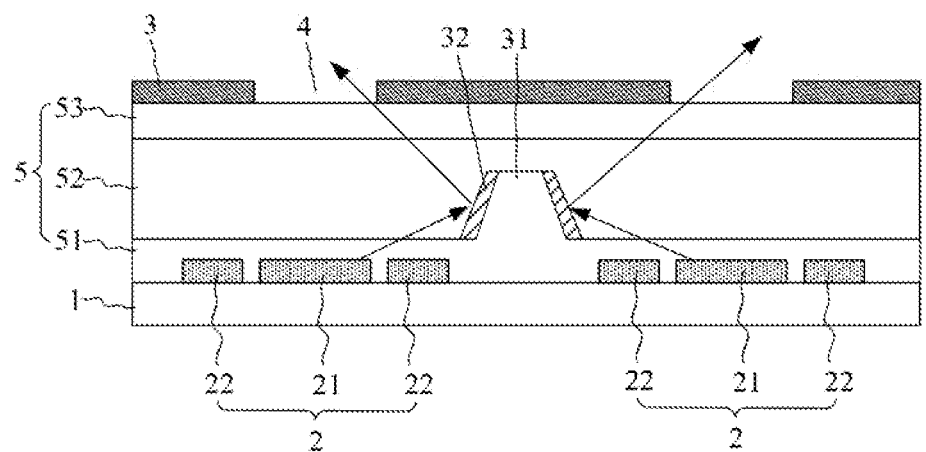
FIG. 40 is a schematic diagram showing a structure of a convex block and a reflection layer according to an embodiment of the present disclosure.

FIG. 40 is a schematic diagram showing a structure of a convex block 31 and a reflection layer 32 according to an embodiment of the present disclosure. In an embodiment, as shown in FIG. 40, the display panel further includes a convex block 31. The convex block 31 is located between the light-emitting element 2 and the light-shielding layer 3. In the direction perpendicular to the plane of the substrate 1, the light-shielding layer 3 covers the convex block 31, and the convex block 31 has a bottom surface provided on a side of the convex block 31 close to the substrate 1 and a side wall intersecting with the bottom surface. The display panel further includes a reflection layer 32, and the reflection layer 32 is provided at the side wall of the convex block 31.

In the direction perpendicular to the plane of the substrate 1, the convex block 31 may be located between the auxiliary light-emitting elements 22 of two adjacent light-emitting elements 2. In addition, please refer to FIG. 40, an auxiliary layer includes a first inorganic encapsulation layer 51, an organic encapsulation layer 52 located at a side of the first inorganic encapsulation layer 51 facing away from the substrate 1, and a second inorganic encapsulation layer 53 located at a side of the organic encapsulation layer 52 facing away from the substrate 1, and the convex block 31 can also be formed by using the first inorganic encapsulation layer 51.

When two adjacent light-emitting elements 2 are configured to emit light of different colors, the light emitted obliquely from the primary light-emitting element 21 or the auxiliary light-emitting element 22 of one of the two adjacent light-emitting elements 2 may pass through the first opening 4 of the adjacent light-emitting element 2, causing crosstalk of light of different colors. For avoiding this, the convex block 31 and the reflection layer 32 are provided in an embodiment of the present disclosure, the reflection layer 32 can reflect part of the light emitted obliquely by the light-emitting element 2, such that these light will exit the display panel through the first opening 4 corresponding to this light-emitting element 2, thereby reducing crosstalk and avoiding color cast.

Figure 41:
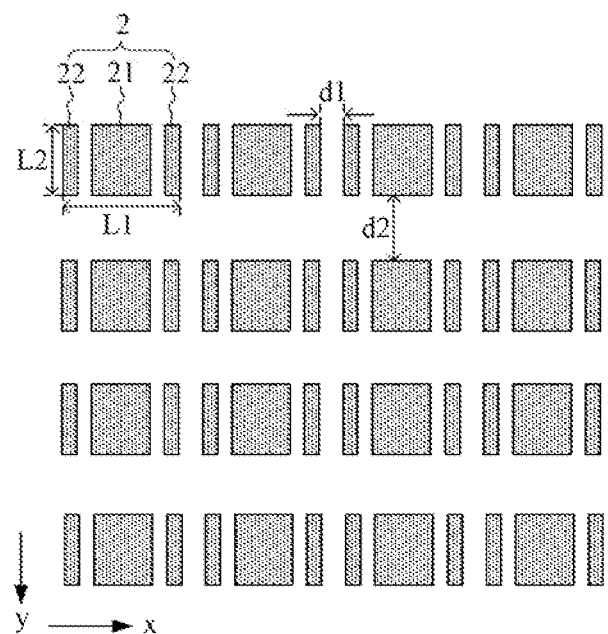
FIG. 41 is a schematic diagram showing an arrangement of light-emitting elements according to an embodiment of the present disclosure.

FIG. 41 is a schematic diagram showing an arrangement of light-emitting elements 2 according to an embodiment of the present disclosure. In some embodiments, as shown in FIG. 41, when the auxiliary light-emitting elements 22 are located at two sides of the primary light-emitting element 21 in the first direction x, a length L1 of the light-emitting element 2 in the first direction x is greater than a length L2 of the light-emitting element 2 in the second direction y. Both the first direction x and the second direction y are parallel to the plane of the substrate 1, and the first direction x intersects with the second direction y. A distance d1 between two light-emitting elements 2 adjacent in the first direction x is set to be smaller than a distance d2 between two light-emitting elements 2 adjacent in the second direction y. In this way, the distance between two primary light-emitting elements 21 adjacent in the first direction x and the distance between two primary light-emitting elements 21 adjacent in the second direction y have a small difference, and in the anti-peering mode, when only the primary light-emitting elements 21 emit light, the uniformity of the brightness of the display panel can be improved.

In one embodiment, please refer to FIG. 1, in the direction perpendicular to the plane of the display panel, an orthographic projection of the primary light-emitting element 21 is within the first opening 4. With such configuration, even if the first opening 4 and/or the primary light-emitting element 21 is offset from a target position due to reasons such as insufficient process accuracy, the first opening 4 can still expose the primary light-emitting element 21, thereby avoiding that the light-shielding layer 3 shields the primary light-emitting element 21, and thus improving the brightness of the display panel in the anti-peering mode.

Figure 42:
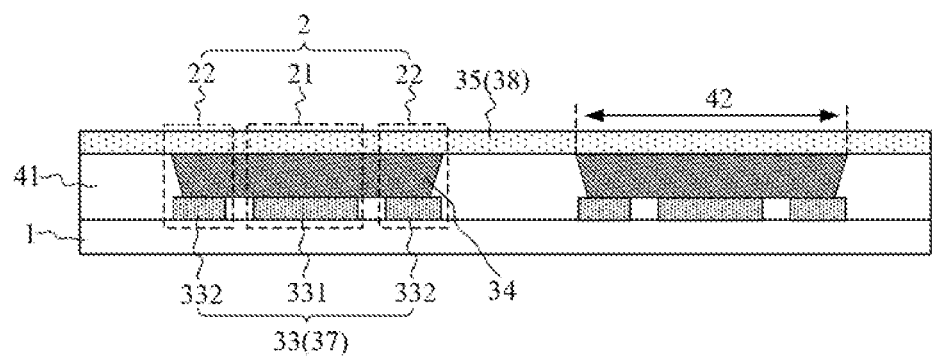
FIG. 42 is a partial cross-sectional view of a display panel according to an embodiment of the present disclosure.

FIG. 42 is a partial cross-sectional view of a display panel according to an embodiment of the present disclosure. In one embodiment, as shown in FIG. 42, the light-emitting element 2 includes a first electrode 33, a light-emitting layer 34, and a second electrode 35. The light-emitting layer 34 is located between the first electrode 33 and the second electrode 35. The first electrode 33 includes a first sub-electrode 331 and a second sub-electrode 332 that are spaced apart from each other. The first sub-electrode 331 belongs to the primary light-emitting element 21, and the second sub-electrode 332 belongs to the auxiliary light-emitting element 22.

In the above-described configuration, the first electrode 33 is divided into the first sub-electrode 331 and the second sub-electrode 332 that are spaced apart. In the sharing mode, a driving voltage is applied to each of the first sub-electrode 331 and the second sub-electrode 332, and both the part of the light-emitting layer 34 between the first sub-electrode 331 and the second electrode 35 and the part of the light-emitting layer 34 between the second sub-electrode 332 and the second electrode 35 emit light, and thus the primary light-emitting element 21 and the auxiliary light-emitting element 22 emit light simultaneously. In the anti-peering mode, a driving voltage is only applied to the first sub-electrode 331, and only the part of the light-emitting layer 34 between the first sub-electrode 331 and the second electrode 35 emits light, and thus the primary light-emitting element 21 emits light and the auxiliary light-emitting element 22 does not emit light.

Figure 43:
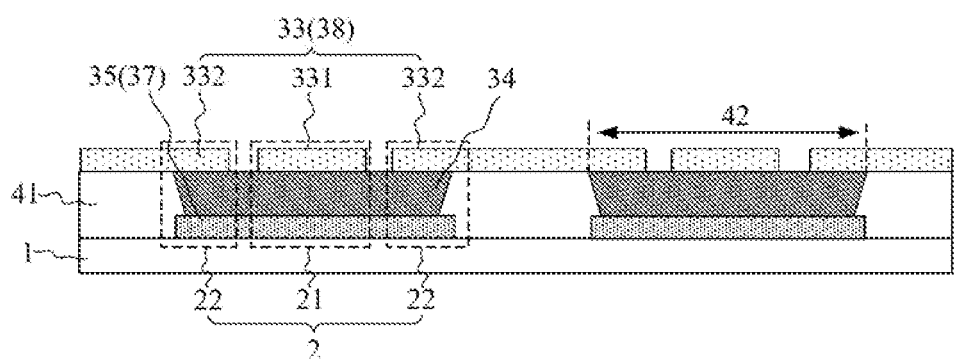
FIG. 43 is another partial cross-sectional view of a display panel according to an embodiment of the present disclosure.

FIG. 43 is another partial cross-sectional view of a display panel according to an embodiment of the present disclosure. In one embodiment, as shown in FIG. 43, the first electrode 33 is a cathode 38, and the first electrode 35 is an anode 37.

In this configuration, the cathode 38 is divided to achieve the independent light emission of the primary light-emitting element 21 and the auxiliary light-emitting element 22. In the sharing mode, a driving voltage is supplied to the anode 37, and a negative power supply voltage is simultaneously supplied to the first sub-electrode 331 and the second sub-electrode 332 of the cathode 38, in this case, both the light-emitting layer 34 between the first sub-electrode 331 and the anode 37 and the light-emitting layer 34 between the second sub-electrode 332 and the anode 37 emit light. In the anti-peering mode, a driving voltage is supplied to the anode 37, and a negative power supply voltage is only supplied to the first sub-electrode 331 of the cathode 38, in this case, only the light-emitting layer 34 between the first sub-electrode 331 and the anode 37 emits light.

Alternatively, in another embodiment, please refer to FIG. 42, the first electrode 33 is an anode 37, and the second electrode 35 is a cathode 38.

In this configuration, the anode 37 of each single light-emitting element 2 is divided to achieve the independent light emission of the primary light-emitting element 21 and the auxiliary light-emitting element 22. In the sharing mode, a negative power supply voltage is supplied to the cathode 38, and the pixel driving circuit 7 supplies a driving voltage to each of the first sub-electrode 331 and the second sub-electrode 332 of the anode 37 simultaneously, in this case, both the light-emitting layer 34 between the first sub-electrode 331 and the anode 37 and the light-emitting layer 34 between the second sub-electrode 332 and the anode 37 emit light, thereby realizing the simultaneous light emission of the primary light-emitting element 21 and the auxiliary light-emitting element 22. In the anti-peering mode, a negative power supply voltage is supplied to the cathode 38, and a driving voltage is only supplied to the first sub-electrode 331 of the anode 37, in this case, only the light-emitting layer 34 between the first sub-electrode 331 and the anode 37 emits light, and thus only the primary light-emitting element 21 emits light.

It should be understood that, in normal cases, the cathodes 38 in the display panel are formed as an entire-surface layer. When driving different light-emitting elements 2 in the display panel to emit light, the cathodes 38 of different light-emitting elements 2 receive a same negative power supply voltage, and the pixel driving circuits 7 provide a same driving current or different driving currents to the anodes 37 of the light-emitting elements 2 electrically connected to the pixel driving circuits 7, thereby driving the light-emitting layers 34 to emit light based on the voltages applied to the cathodes 38 and the anodes 37. If the cathode 38 is divided to achieve the independent light emissions of the primary light-emitting element 21 and the auxiliary light-emitting element 22, the first sub-electrode 331 and the second sub-electrode 332 of the cathode 38 are spaced apart from each other, so it is necessary to provide a separate negative power supply signal line that is electrically connected to the first sub-electrode 331 and the second sub-electrode 332 of the cathode 38. If the anode 37 is divided to achieve independent light emissions of the primary light-emitting element 21 and the auxiliary light-emitting element 22, the cathode 38 can still be formed as an entire-surface layer, and it is not necessary to provide an additional negative power supply signal line and thus improving the feasibility of the process.

Figure 44:
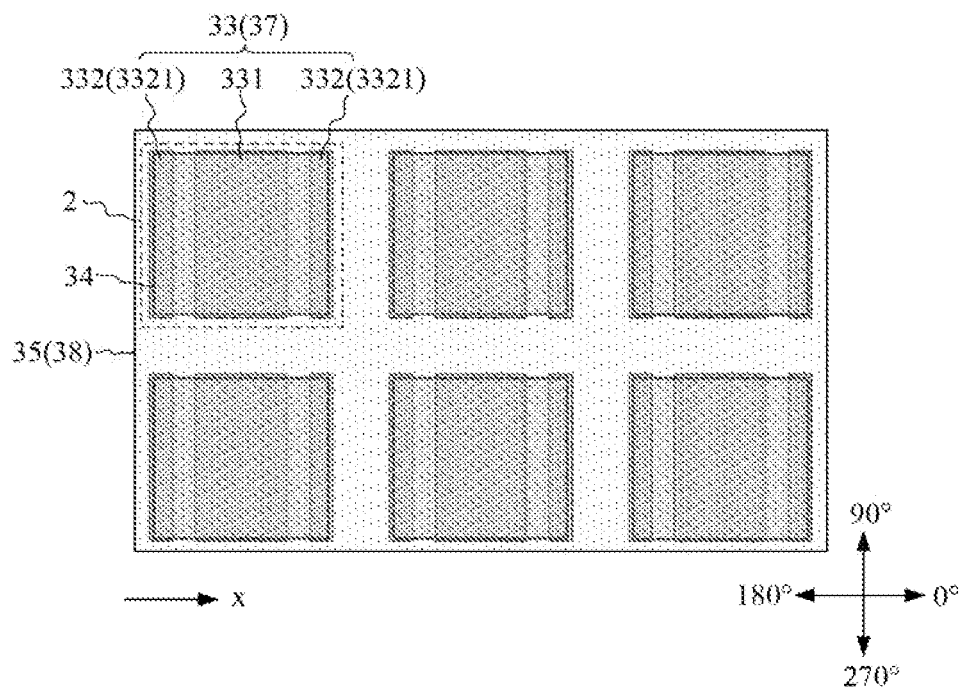
FIG. 44 is a partial cross-sectional view of a display panel according to an embodiment of the present disclosure.

FIG. 44 is a partial cross-sectional view of a display panel according to an embodiment of the present disclosure. In one embodiment, as shown in FIG. 44, the second sub-electrode 332 includes two first edge electrodes 3321, and the two first edge electrodes 3321 are located at two sides of the first sub-electrode 331 in the first direction x, respectively. The first direction x is parallel to the plane of the substrate 1. In conjunction with FIG. 13, it should be noted that two first edge electrodes 3321 correspond to two first auxiliary light-emitting elements 22, respectively.

As described above, in the embodiments of the present disclosure, the first direction x may refer to a direction corresponding to 0° or 180°. In the sharing mode, for the display device such as a mobile phone, a computer, and the like, when other viewers view the displayed image, most of other viewers view the displayed image at the left side or the right side of the display panel. In the embodiments of the present disclosure, two first edge electrodes 3321 are respectively arranged at two sides of the first sub-electrode 331 in the first direction x, that is, the two first auxiliary light-emitting sub-elements 221 are respectively arranged at two sides of the primary light-emitting the element 21 as shown in FIG. 13. In the sharing mode, a driving voltage is supplied to each of two first edge electrodes 3321, that is, each of two first auxiliary light-emitting sub-elements 221 is driven to emit light, so that the brightness of the display panel can be improved at large viewing angles at the left side and the right side, thereby improving the viewer's viewing experience in the sharing mode.

Figure 45:
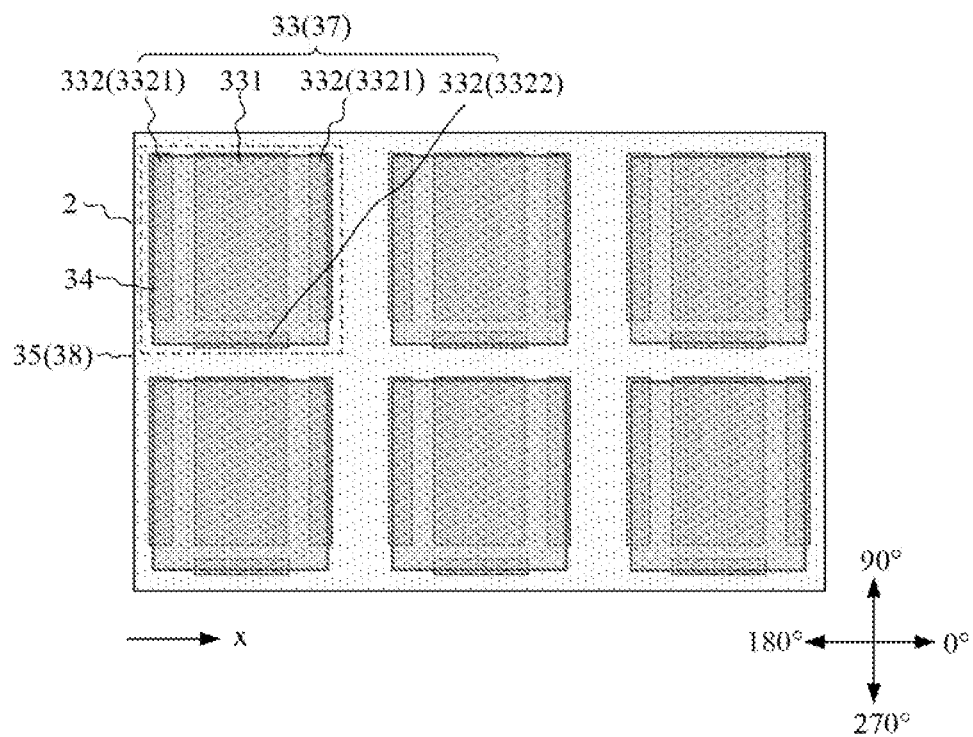
FIG. 45 is another partial cross-sectional view of a display panel according to an embodiment of the present disclosure.

FIG. 45 is another partial cross-sectional view of a display panel according to an embodiment of the present disclosure. As shown in FIG. 45, the second sub-electrode 332 further includes a second edge electrode 3322 that is at a side of the first sub-electrode 331 in the second direction y. The second direction y is parallel to the plane of the substrate 1 and intersects with the first direction x. In conjunction with FIG. 14, it should be noted that the second edge electrode 3322 corresponds to the second auxiliary light-emitting sub-element 222.

In the sharing mode, in addition to viewing the displayed image at the left side and the right side of the display panel, viewers may also view the displayed image at an upper side of the display panel in many cases. For example, the display panel is placed on a desk, and the viewer is standing and viewing the displayed image of the display panel, this case can be regarded as the viewer viewing the displayed image at an upper side of the display panel. In an embodiment of the present disclosure, the second direction y may refer to a direction corresponding to 270°. That is, in the direction in the plane of the substrate 1, the second edge electrode 3322 is arranged at a lower side of the first edge electrode 3321. In this case, in the sharing mode, a driving voltage is supplied to the second edge electrode 3322, that is, the second auxiliary light-emitting sub-element 222 is driven to emit light. The light emitted by the second auxiliary light-emitting sub-element 222 exits through the first opening 4, the exiting direction is close to the viewing angel of 90°, so the brightness of the display panel at an upper-side viewing angle can be improved, which is beneficial to improving viewers' viewing experience in the sharing mode.

Figure 46:
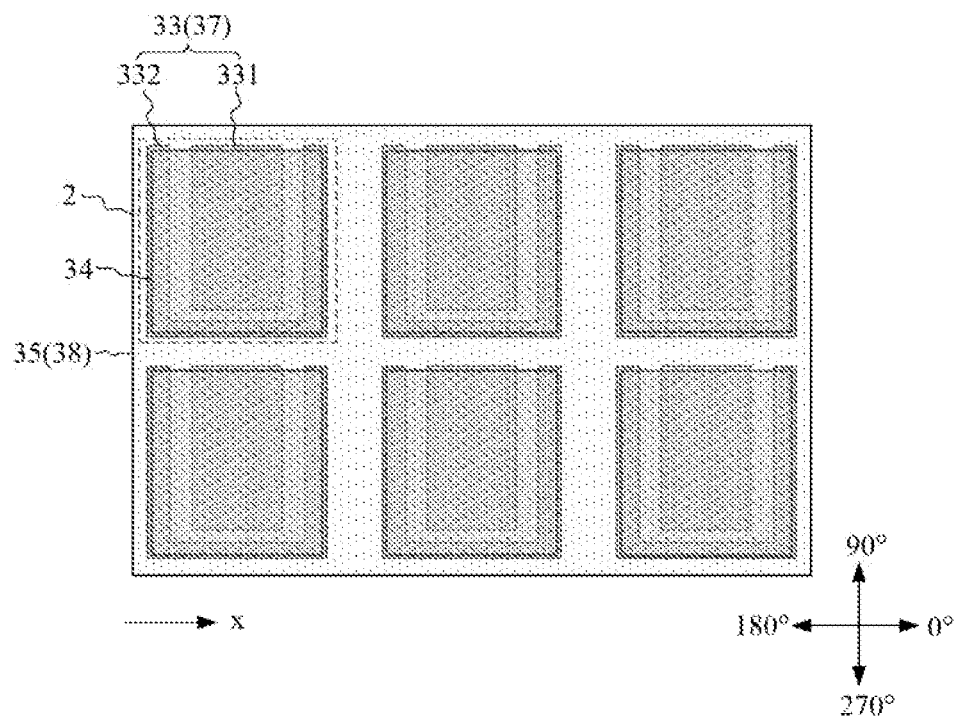
FIG. 46 is yet another partial cross-sectional view of a display panel according to an embodiment of the present disclosure.
Figure 47:
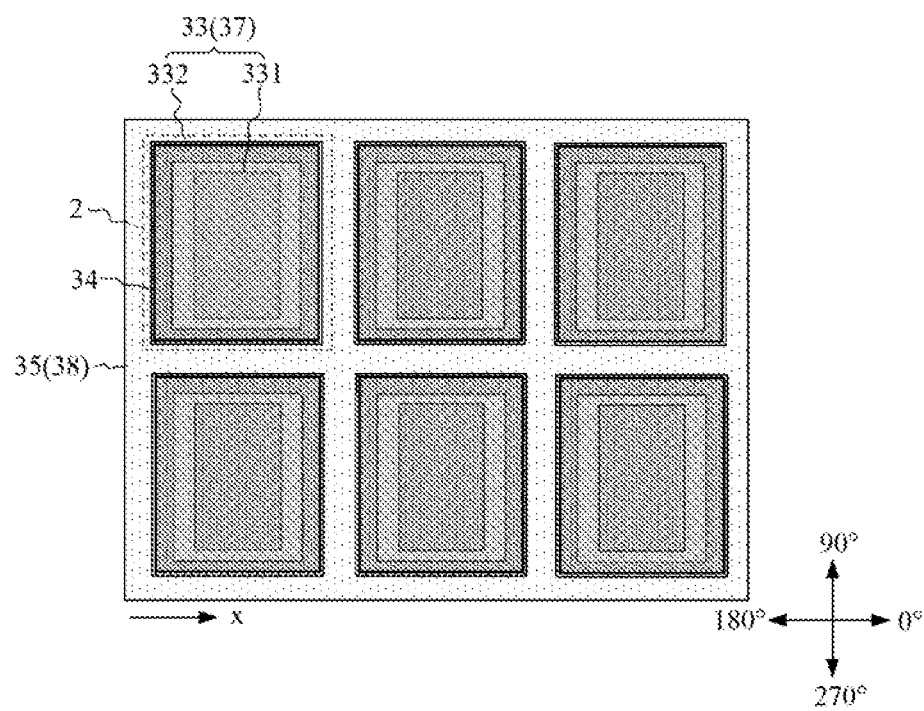
FIG. 47 is yet another partial cross-sectional view of a display panel according to an embodiment of the present disclosure.

FIG. 46 is yet another partial cross-sectional view of a display panel according to an embodiment of the present disclosure. FIG. 47 is yet another partial cross-sectional view of a display panel according to an embodiment of the present disclosure. In one embodiment, as shown in FIG. 46 and FIG. 47, the first sub-electrode 331 is surrounded by the second sub-electrode 332.

As shown in FIG. 46, the first sub-electrode 331 is partially surrounded by the second sub-electrode 332. In conjunction with FIG. 18, the primary light-emitting element 21 is partially surrounded by the corresponding auxiliary light-emitting element 22. In this structure, the second sub-electrode 332 may be located at at least one of sides of the first sub-electrode 331 in the first direction x and sides of the first sub-electrode 331 in the second direction y. Combined with the above analysis, such configuration can effectively improve the brightness of the display panel when viewed at the upper viewing angle, the left viewing angle and the right viewing angle.

Alternatively, as shown in FIG. 47, the first sub-electrode 331 may be surrounded by the second sub-electrode 332. In conjunction with FIG. 19, the primary light-emitting element 21 may be surrounded by the corresponding auxiliary light-emitting element 22. In such configuration, the second sub-electrode 332 surrounds the first sub-electrode 331 in all directions. In the sharing mode, the second sub-electrode receives a driving voltage to drive the auxiliary light-emitting element 22 to emit light, thereby increasing the viewable angle range in all directions, and being beneficial to improving the uniformity of the brightness of the display panel at various viewing angles.

Figure 48:
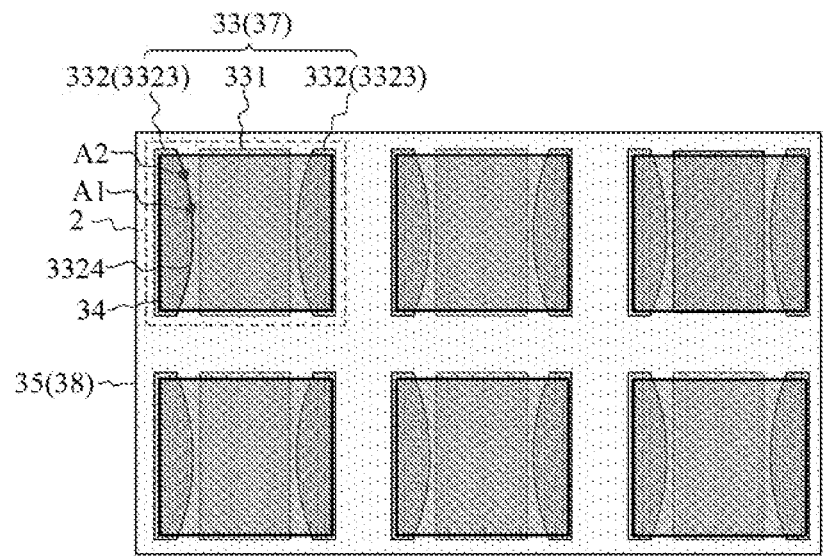
FIG. 48 is yet another partial cross-sectional view of a display panel according to an embodiment of the present disclosure.

FIG. 48 is yet another partial cross-sectional view of a display panel according to an embodiment of the present disclosure. In one embodiment, as shown in FIG. 48, the second sub-electrode 332 includes a strip-shaped electrode part 3323. In the direction perpendicular to the plane of the substrate 1, an orthographic projection of the strip-shaped electrode part 3323 includes a first electrode edge 3324 close to the first sub-electrode 331. The first electrode edge 331 is of an arc shape, and the first electrode edge 3324 is convex in a direction towards the first sub-electrode 331.

In another expression, in the direction perpendicular to the plane of the substrate 1, the orthographic projection of the strip-shaped electrode part 3323 includes the first electrode edge 3324 close to the first sub-electrode 331. The first electrode edge 3324 includes a first point A1 and a second point A2, and a distance between the first point A1 and the first sub-electrode 331 is smaller than a distance between the second point A2 and the first sub-electrode 331. A minimum distance from the first point A1 to the end of the strip-shaped electrode part 3323 is greater than a minimum distance from the second point A2 to the end of the strip-shaped electrode part 3323. In conjunction with FIG. 15, it should be noted that the strip-shaped electrode part 3323 corresponds to the strip-shaped light-emitting portion 223.

In the embodiments of the present disclosure, the first electrode edge 3324 of the strip-shaped electrode part 3323 is formed as an arc-shaped edge that is convex in a direction towards the first sub-electrode 331. In a first aspect, a distance between a position of the convex part of the first electrode edge 3324 and an edge of the first opening 4 facing away from the strip-shaped electrode part 3323 is different from a distance between a position of the non-convex part of the first electrode edge 3324 and an edge of the first opening 4 facing away from the strip-shaped electrode part 3323. In this way, the light emitted by different positions on the first electrode edge 3324, when exiting through the edge of the first opening 4, have different propagation angles, thereby effectively weakening the sudden change of brightness at different viewing angles. In a second aspect, the convex part of the strip-shaped electrode part 3323 is closer to the first sub-electrode 331, that is, closer to the first opening 4. In this way, when the display panel is in the sharing mode, in conjunction with FIG. 15, the light emitted by the convex part of the strip-shaped light-emitting part 223 and exiting through the first opening 4 can increase the brightness of the display panel at large viewing-angles, thereby improving the display effect of the display panel in the sharing mode. In a third aspect, the process of forming a film with a concave edge based on the existing process technology is relatively difficult. Therefore, the first electrode edge 3324 of the strip-shaped electrode part 3323 is set as an arc-shaped edge that is convex in the direction towards the first sub-electrode 331, so that the process difficulty of the strip-shaped electrode part 3323 can be reduced accordingly.

In one embodiment, please refer to FIG. 44, one edge of the second sub-electrode 332 is adjacent to one edge of the first sub-electrode 331, and the two adjacent edges of the first sub-electrode 331 and the second sub-electrode 332 are straight-line edges. That is, the edge of the second sub-electrode 332 facing the first sub-electrode 331 is a straight-line edge, and the edge of the first sub-electrode 331 facing the second sub-electrode 332 is also a straight-line edge, and the two opposite edges of the first sub-electrode 331 and the second sub-electrode 332 are parallel to and adjacent to each other.

The process of forming a film with a concave edge based on the existing process technology is difficult. In the embodiments of the present disclosure, the two edges of the primary light-emitting element 21 and the auxiliary light-emitting element 22 are formed as straight-line edges, so that the two edges can be easily set to be parallel, that is, the uniformity of the distance between the primary light-emitting element 21 and the auxiliary light-emitting element 22 is easier to realize, which is beneficial to improving the uniformity of brightness of the display panel when viewed at different viewing angles in the sharing mode.

Figure 49:
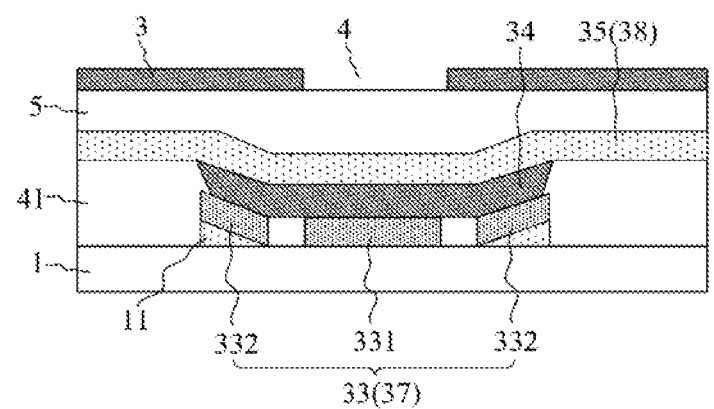
FIG. 49 is yet another partial cross-sectional view of a display panel according to an embodiment of the present disclosure.

FIG. 49 is yet another partial cross-sectional view of a display panel according to an embodiment of the present disclosure. In one embodiment, as shown in FIG. 49, in a direction from the first sub-electrode 331 to the second sub-electrode 332, the second sub-electrode 332 inclines in a direction towards a light-exiting plane of the display panel.

In other words, in the direction from the first sub-electrode 331 to the second sub-electrode 332, a spacing between the second sub-electrode 332 and the substrate 1 increases. In conjunction with FIG. 17, it should be noted that the inclined arrangement of the second sub-electrode 332 corresponds to the inclined arrangement of the auxiliary light-emitting element 22.

When two adjacent light-emitting elements 2 are configured to emit light of different colors, the light emitted obliquely from the second sub-electrode 332 in one of the two adjacent light-emitting elements 2 may pass through the first opening 4 of the adjacent light-emitting element 2, causing crosstalk of light of different colors. For avoiding this, in the embodiments of the present disclosure, the second sub-electrode 332 is obliquely arranged, and accordingly the light-emitting layer 34 on the second sub-electrode 332 is obliquely arranged, so that the oblique light emitted by the light-emitting layer 34 may more likely pass through the first opening 4 corresponding to the light-emitting element 2 where the second sub-electrode 332 is located, thereby reducing the crosstalk and color cast.

In one embodiment, please refer to FIG. 42, the display panel further includes a pixel define layer 41. The pixel define layer 41 includes a second opening 42, and the primary light-emitting element 21 and the auxiliary light-emitting element 22 share a second opening 42. That is, the first sub-electrode 331 and the second sub-electrode 332 of a same light-emitting element 2 are both exposed by a same second opening 42. With such configuration, the second opening has a large area, thereby reducing the process difficulty of forming the second opening 42 in the pixel definition layer 41.

Figure 50:
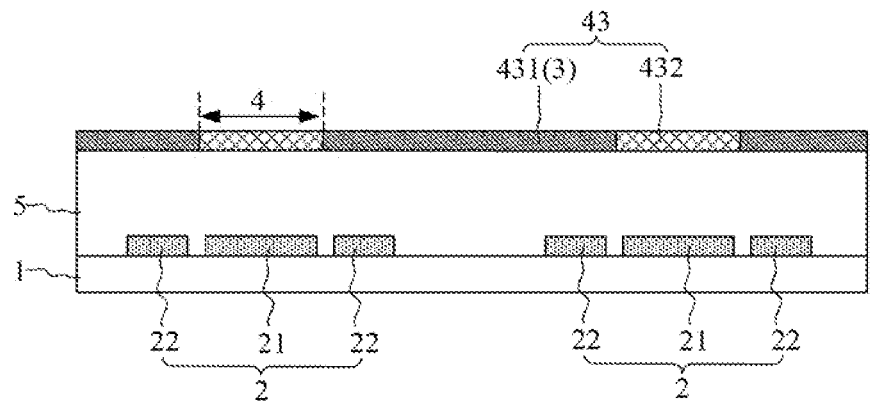
FIG. 50 is a schematic diagram showing a structure of a color filter layer according to an embodiment of the present disclosure.

FIG. 50 is a schematic diagram showing a structure of a color filter layer 43 according to an embodiment of the present disclosure. In one embodiment, as shown in FIG. 50, the display panel further includes a color filter layer 43. The color filter layer 43 is located at a side of the light-emitting element 2 facing away from the substrate 1. The color filter layer 43 includes a black matrix 431 and color resists 432. In the direction perpendicular to the plane of the substrate 1, the color resist 432 covers the primary light-emitting element 21, and the light-shielding layer 3 is reused as the black matrix 431. It should be noted that the color of the color resist 432 is the same as the color of the light emitted from the primary light emitting element 21 that overlaps with the color resist 432.

By arranging the color filter layer 43 at the side of the light-emitting element 2 facing away from the substrate 1, the color resist 432 in the color filter layer 43 can filter the external ambient light having a color different from the color of the color resist 432, thereby reducing the amount of the external ambient light that enters the interior of the display panel through the first opening 4 and reducing reflections. Furthermore, when two adjacent light-emitting elements 2 are configured to emit light of different colors, the light emitted by one light-emitting element 2 may travel to the first opening 4 corresponding to the adjacent light-emitting element 2, and these light will be filtered by the color resist 432 of the first opening 4 corresponding to the adjacent light-emitting element 2 and cannot exit the display panel, thereby reducing the color cast. In addition, the black matrix 431 in the color filter layer 43 is reused as the light-shielding layer 3, so the process flow can be simplified, and the thickness of the display panel can be reduced.

Based on a same inventive concept, an embodiment of the present disclosure provides a method for driving a display panel. The method is used for driving the display panel described above.

Figure 51:
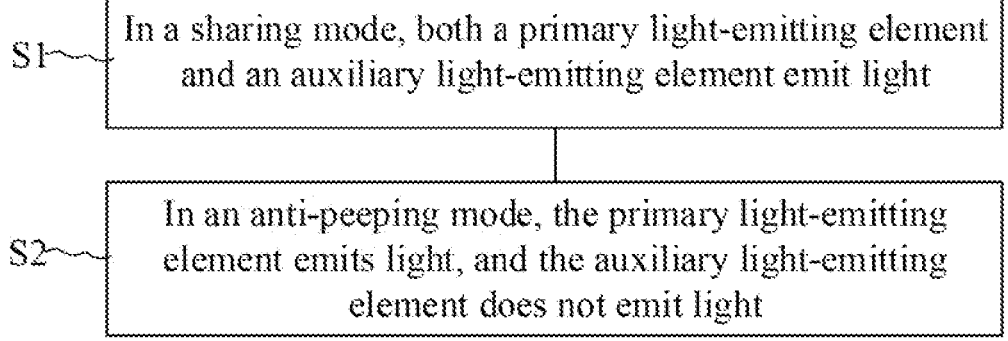
FIG. 51 is a flowchart of a driving method according to an embodiment of the present disclosure.

A display mode of the display panel includes an anti-peering mode and a sharing mode. FIG. 51 is a flowchart of a driving method according to an embodiment of the present disclosure. As shown in FIG. 1 to FIG. 4 and FIG. 51, the driving method includes the following steps.

At step S1, in the sharing mode, both the primary light-emitting element 21 and the auxiliary light-emitting element 22 emit light.

At step S2, in the anti-peering mode, the primary light-emitting element 21 emits light, and the auxiliary light-emitting element 22 does not emit light.

As shown in FIG. 5, in the sharing mode, both the primary light-emitting element 21 and the auxiliary light-emitting element 22 are controlled to emit light. The light emitted by the primary light-emitting element 21 exits the display panel through the first opening 4 above the primary light-emitting element 21, and when exiting the display panel, this light will travel in a direction of a small viewing angle close to the frontal viewing angle. At the same time, the light emitted by the auxiliary light-emitting element 22 exits the display panel through the first opening 4 obliquely above the auxiliary light-emitting element 22, and when exiting the display panel, this light will travel in a direction of a large viewing angle. As a result, viewers can see the displayed image at different viewing angles.

As shown in FIG. 6, in the anti-peering mode, the primary light-emitting element 21 is controlled to emit light, and the auxiliary light-emitting element 22 is controlled to not emit light. In this case, only the light emitted by the primary light-emitting element 21 passes the first opening 4 and exits the display panel, and these light travels substantially in the direction of the frontal viewing angle. Therefore, the display panel has a small viewable range, and the display panel is in the anti-peering mode. The viewer can see the displayed image at the frontal viewing angle but cannot see the displayed image at the oblique viewing angle, thereby protecting the privacy of the user well.

To sum up, in the embodiments of the present disclosure, the light-exiting angle of the display panel can be adjusted by controlling a light-emitting state of the auxiliary light-emitting element 22, such that the display panel can be switched between different display modes, and the display mode control of the display panel is more flexible, thereby improving the use experience.

In one embodiment, in conjunction with FIG. 7 and FIG. 8, the display panel further includes a mode controlling module 6, and the mode controlling module 6 is configured to control a light-emitting state of the auxiliary light-emitting element 22 according to the display mode of the display panel. The display panel further includes a pixel driving circuit 7. The pixel driving circuit 7 is electrically connected to the primary light-emitting element 21 and is also electrically connected to the auxiliary light-emitting element 22 through the mode controlling module 6.

In the sharing mode, the process that both the primary light-emitting element 21 and the auxiliary light-emitting element 22 emit light is as follows. The pixel driving circuit 7 sends a driving current to the primary light-emitting element 21 so as to dive drive the primary light-emitting element 21 to emit light. The mode controlling module 6 controls a path between the pixel driving circuit 7 and the auxiliary light-emitting element 22 to be conductive and sends the driving current provided by the pixel driving circuit 7 to the auxiliary light-emitting element 22 so as to drive the auxiliary light-emitting element 22 to emit light.

In the anti-peering mode, the process that the primary light-emitting element 21 emits light and the auxiliary light-emitting element 22 does not emit light is as follows. The pixel driving circuit 7 sends a driving current to the primary light-emitting element 21 so as to drive the primary light-emitting element 21 to emit light. The mode controlling module 6 controls a path between the pixel driving circuit 7 and the auxiliary light-emitting element 22 to be disconnected.

Based on the driving method described above, in the sharing mode, the auxiliary light-emitting element 22 and the primary light-emitting element 21 emit light by sharing a driving current provided by a same pixel driving circuit 7. On the one hand, the brightness of the auxiliary light-emitting element 22 is the same as the brightness of the primary light-emitting element 21, thereby optimizing the light-emitting effect of a single light-emitting element 2. On the other hand, it is not necessary to provide an additional circuit for providing the driving current for the auxiliary light-emitting element 22, thereby simplifying the circuit design of the display panel and saving the space occupied by the driving circuit in the display panel, as well as being beneficial to improving the pixel density.

Furthermore, in conjunction with FIG. 9 to FIG. 11, the pixel driving circuit 7 is electrically connected to the first light-emitting control signal line Emit1. The first light-emitting control signal line Emit1 is configured to output a first enable level and a first disable level for controlling the light-emitting state of the primary light-emitting element 21. The mode controlling module 6 is electrically connected to a second light-emitting control signal line Emit2. The second light-emitting control signal line Emit2 is configured to output a second enable level and a second disable level for controlling the light-emitting state of the auxiliary light-emitting element 22. The first enable level and the second enable level each are a low level.

The display panel further includes a regulating module 8. The regulating module 8 includes a NOR gate 81 and an inverter 82. A first input terminal of the NOR gate 81 is electrically connected to the first light-emitting control signal line Emit1, and a second input terminal of the NOR gate 81 is electrically connected to a regulating signal line Ctl. An input terminal of the inverter 82 is electrically connected to an output terminal of the NOR gate 81, and an output terminal of the inverter 82 is electrically connected to the second light-emitting control signal line Emit2.

The process that the second light-emitting control signal line Emit2 outputs the second enable level in the sharing mode is as follows. The regulating signal line Ctl outputs a low level. The NOR gate 81 outputs a high level according to the low level outputted by the regulating signal line Ctl and the low level outputted by the first light-emitting control signal line Emit1. The inverter 82 outputs a low level according to the high level outputted by the NOR gate 81. The process that the second light-emitting control signal line Emit2 outputs the second disable level in the anti-peering mode is as follows. The regulating signal line Ctl outputs a high level, the NOR gate 81 outputs a low level, and the inverter 82 outputs a high level according to the low level outputted by the low level outputted by the NOR gate 81.

In conjunction with FIG. 11, in the sharing mode, the regulating signal line Ctl outputs a low level. When the first light-emitting control signal line Emit1 outputs a high level, the NOR gate 81 outputs a low level, the inverter 82 outputs a high level to the second light-emitting control signal line Emit2 according to the low level outputted by the NOR gate 81, so as to control the auxiliary light-emitting element 22 not to emit light. When the first light-emitting control signal line Emit1 outputs a low level, the NOR gate 81 outputs a high level, the inverter 82 outputs a low level to the second light-emitting control signal line Emit2 according to the high level outputted by the NOR gate 81, so as to control the auxiliary light-emitting element 22 to emit light.

In the anti-peering mode, the regulating signal line Ctl outputs a high level. In this case, whether the first light-emitting control signal line Emit1 outputs a high level or a low level, the NOR gate 81 outputs a low level, and the inverter 82 outputs a high level according to the low level outputted by the NOR gate 81, so as to control the auxiliary light-emitting element 22 not to emit light.

Figure 52:
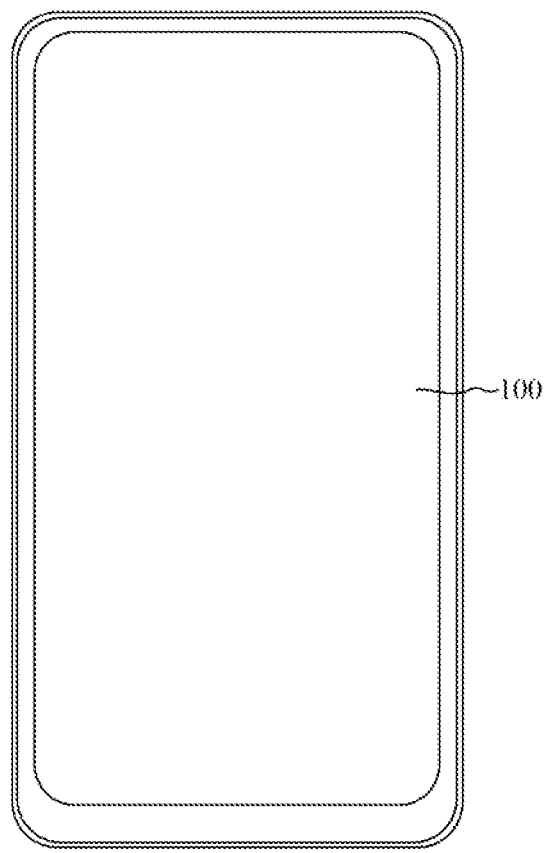
FIG. 52 is a schematic diagram showing a structure of a display device according to an embodiment of the present disclosure.

Based on a same inventive concept, an embodiment of the present disclosure further provides a display device. FIG. 52 is a schematic diagram of a display device according to an embodiment of the present disclosure. As shown in FIG. 52, the display device includes the display panel 100 described above. A structure of the display panel 100 has been explained in the above embodiments, and will not be repeatedly described herein. Of course, the display device shown in FIG. 52 is for exemplary illustration. The display device can be any device with a display function, such as a mobile phone, a tablet computer, a notebook computer, a television or the like.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising:
  a substrate;
  a light-emitting element located at a side of the substrate and comprising a primary light-emitting element and an auxiliary light-emitting element; and
  a light-shielding layer located at a side of the light-emitting element facing away from the substrate, the light-shielding layer comprising a first opening corresponding to the primary light-emitting element, and the auxiliary light-emitting element being arranged at a periphery of the primary light-emitting element,
  wherein in a direction perpendicular to a plane of the substrate, an orthographic projection of the auxiliary light-emitting element is located within an orthographic projection of the light-shielding layer, and the auxiliary light-emitting element does not overlap with the first opening.

2. The display panel according to claim 1, wherein the display panel has a display mode comprising a sharing mode and an anti-peeping mode;

when the display panel is in the sharing mode, the primary light-emitting element emits light, and the auxiliary light-emitting element emits light; and when the display panel is in the anti-peeping mode, the primary light-emitting element emits light, and the auxiliary light-emitting element does not emit light.

3. The display panel according to claim 1, further comprising:
  a mode controlling module and a pixel driving circuit that is electrically connected to the primary light-emitting element,
  wherein the mode controlling module is configured to control a light-emitting state of the auxiliary light-emitting element according to the display mode of the display panel, and the pixel driving circuit is further electrically connected to the auxiliary light-emitting element through the mode controlling module.

4. The display panel according to claim 1, further comprising:
  a mode controlling module and a pixel driving circuit, wherein the mode controlling module is configured to control a light-emitting state of the auxiliary light-emitting element according to the display mode of the display panel, and the pixel driving circuit comprises:
  a driving transistor,
  a first light-emitting control module, and
  a second light-emitting control module,
    wherein the first light-emitting control module is electrically connected between the driving transistor and the primary light-emitting element, and the second light-emitting control module is electrically connected between the driving transistor and the auxiliary light-emitting element; and
  wherein the mode controlling module is reused as the second light-emitting control module.

5. The display panel according to claim 1, further comprising:
  a pixel driving circuit, and
  a mode controlling module that is configured to control a light-emitting state of the auxiliary light-emitting element according to the display mode of the display panel,
  wherein the pixel driving circuit is electrically connected to a first light-emitting control signal line, and the mode controlling module is electrically connected to a second light-emitting control signal line; and
  further wherein the display panel further comprises a regulating module that is electrically connected to the first light-emitting control signal line and the second light-emitting control signal line, wherein in the sharing mode, the regulating module is configured to:
    generate, according to a first enable level outputted by the first light-emitting control signal line, a second enable level, and output the second enable level to the second light-emitting control signal; and
    in the anti-peeping mode, the regulating module is configured to:
  generate, according to a first enable level or a first disable level outputted by the first light-emitting control signal line, a second disable level, and output the second disable level to the second light-emitting control signal.

6. The display panel according to claim 1, further comprising a first reset controlling module, wherein the first reset controlling module is electrically connected between a reset signal line and the auxiliary light-emitting element.

7. The display panel according to claim 1, wherein the auxiliary light-emitting element comprises two first auxiliary light-emitting sub-elements, wherein the two first auxiliary light-emitting sub-elements are located at two sides of the primary light-emitting element in a first direction, respectively, and the first direction is parallel to a plane of the substrate.

8. The display panel according to claim 7, wherein the auxiliary light-emitting element further comprises a second auxiliary light-emitting sub-element, and the second auxiliary light-emitting sub-element is located at a side of the primary light-emitting element in a second direction, wherein the second direction is parallel to the plane of the substrate and intersects with the first direction.

9. The display panel according to claim 1, wherein the auxiliary light-emitting element comprises a strip-shaped light-emitting part having two ends,
wherein in a direction parallel to a third direction and from either of the two ends of the strip-shaped light-emitting part to a center of the strip-shaped light-emitting part, a distance between the strip-shaped light-emitting part and the primary light-emitting element decreases, wherein the third direction is perpendicular to a direction along which the strip-shaped light-emitting part and the primary light-emitting element are arranged.

10. The display panel according to claim 1, wherein an edge of the auxiliary light-emitting element is adjacent to an edge of the primary light-emitting element, and the two adjacent edges are straight-line edges.

11. The display panel according to claim 1, wherein in a direction from the primary light-emitting element to the auxiliary light-emitting element, the auxiliary light-emitting element inclines in a direction towards a light-exiting plane of the display panel.

12. The display panel according to claim 1, wherein the primary light-emitting element is surrounded by the auxiliary light-emitting element.

13. The display panel according to claim 1, wherein in a direction perpendicular to a plane of the substrate, a shape of an orthographic projection of the primary light-emitting element is selected from a group consisting of a circle, an ellipse and a circle-like polygon.

14. The display panel according to claim 1,
wherein an edge of the primary light-emitting element close to the auxiliary light-emitting element has a first convex-concave structure, and
an edge of the auxiliary light-emitting element close to the primary light-emitting element has a second convex-concave structure, and
wherein a concave part of the first convex-concave structure surrounds a convex part of the second convex-concave structure, and a concave part of the second convex-concave structure surrounds a convex part of the first convex-concave structure.

15. The display panel according to claim 1,
wherein in a direction perpendicular to a plane of the substrate, an orthographic projection of the primary light-emitting element comprises a first edge extending in a first direction and a second edge extending in a second direction, wherein both the first direction and the second direction are parallel to the plane of the substrate, and the first direction intersects with the second direction; and
wherein a distance A between the first edge and an edge of the first opening adjacent to the first edge in the second direction and a distance B between the second edge and an edge of the first opening adjacent to the second edge in the first direction satisfy B<A.

16. The display panel according to claim 1, wherein the light-emitting element comprises at least two primary light-emitting elements, and any two of the at least two primary light-emitting elements are spaced apart by one of the auxiliary light-emitting elements.

17. The display panel according to claim 16 further comprising at least one pixel driving circuit, wherein at least two primary light-emitting elements are electrically connected to at least two of the at least one pixel driving circuit in one-to-one correspondence, or at least two primary light-emitting elements are electrically connected to a same one of the at least one pixel driving circuit.

18. The display panel according to claim 16, wherein the auxiliary light-emitting element has at least two notches that are in one-to-one correspondence with the at least two primary light-emitting elements, and at least part of the at least two primary light-emitting elements is located within the corresponding at least two notches.

19. The display panel according to claim 16,
wherein the light-emitting element comprises at least one of a first light-emitting element or a second light-emitting element,
wherein the first light-emitting element comprises two primary light-emitting elements, wherein in the first light-emitting element, the auxiliary light-emitting element is of a zigzag structure and has a first auxiliary light-emitting part, a second auxiliary light-emitting part, and a third auxiliary light-emitting part that are connected sequentially, and the two primary light-emitting elements located are at two sides of the second auxiliary light-emitting part;
wherein the second light-emitting element comprises four primary light-emitting elements, wherein in the second light-emitting element, the auxiliary light-emitting element is of a cross-shaped structure and has a center part and four branch parts each connected to the center part, and every two adjacent branch parts of the four branch parts are spaced by one of the four primary light-emitting elements.

20. The display panel according to claim 19, wherein the first light-emitting element comprises a red light-emitting element and a green light-emitting element, and the second light-emitting element comprises a blue light-emitting element.

21. The display panel according to claim 1, further comprising an auxiliary light-shielding that is located between the light-shielding layer and the light-emitting element, wherein in a direction perpendicular to a plane of the substrate, the light-shielding layer covers the auxiliary light-shielding layer.

22. The display panel according to claim 1, further comprising a convex block located between the light-emitting element and the light-shielding layer,
wherein in a direction perpendicular to a plane of the substrate, the light-shielding layer covers the convex block, and the convex block has a bottom surface close to the substrate and a side wall intersecting with the bottom surface; and
wherein the display panel further comprises a reflection layer, and the reflection layer is provided at the side wall of the convex block.

23. The display panel according to claim 1,
wherein a length of the light-emitting element in a first direction is greater than a length of the light-emitting element in a second direction, both the first direction and the second direction are parallel to a plane of the substrate, and the first direction intersects with the second direction, and wherein a distance between two light-emitting elements adjacent in the first direction is smaller than a distance between two light-emitting elements adjacent in the second direction.

24. The display panel according to claim 1, wherein in a direction perpendicular to a plane of the display panel, an orthographic projection of the primary light-emitting element is within the first opening.

25. The display panel according to claim 1, further comprising a pixel define layer, wherein the pixel define layer comprises a second opening, and the primary light-emitting element and the auxiliary light-emitting element share the second opening.

26. The display panel according to claim 1, further comprising a filter layer that is located at a side of the light-emitting element facing away from the substrate, wherein the filter layer comprises a black matrix and a color resistor, and in a direction perpendicular to a plane of the substrate, the color resistor covers the primary light-emitting element, and the light-shielding layer is reused as the black matrix.

27. A display device, comprising a display panel, comprising:
a substrate;
a light-emitting element located at a side of the substrate and comprising a primary light-emitting element and an auxiliary light-emitting element; and
a light-shielding layer located at a side of the light-emitting element facing away from the substrate, the light-shielding layer comprising a first opening corresponding to the primary light-emitting element, and the auxiliary light-emitting element being arranged at a periphery of the primary light-emitting element,
wherein in a direction perpendicular to a plane of the substrate, an orthographic projection of the auxiliary light-emitting element is located within an orthographic projection of the light-shielding layer, and the auxiliary light-emitting element does not overlap with the first opening.

28. A display panel, comprising:
a substrate;
a light-emitting element located at a side of the substrate and comprising a primary light-emitting element and an auxiliary light-emitting element; and
a light-shielding layer located at a side of the light-emitting element facing away from the substrate, the light-shielding layer comprising a first opening corresponding to the primary light-emitting element, and the auxiliary light-emitting element being arranged at a periphery of the primary light-emitting element,
wherein the light-emitting element comprises a first electrode, a light-emitting layer and a second electrode, and the light-emitting layer is located between the first electrode and the second electrode; and
wherein the first electrode comprises a first sub-electrode and a second sub-electrode that are spaced apart from each other, the first sub-electrode belongs to the primary light-emitting element, and the second sub-electrode belongs to the auxiliary light-emitting element.

29. The display panel according to claim 28, wherein the second sub-electrode comprises two first edge electrodes that are located at two sides of the first sub-electrode in a first direction, respectively, and wherein the first direction is parallel to a plane of the substrate.

30. The display panel according to claim 29, wherein the second sub-electrode comprises a second edge electrode that is located at a side of the first sub-electrode in a second direction, and wherein the second direction is parallel to the plane of the substrate and intersects with the first direction.

31. The display panel according to claim 28, wherein the second sub-electrode surrounds the first sub-electrode.

32. The display panel according to claim 28, wherein the second sub-electrode comprises a strip-shaped electrode part, wherein in a direction perpendicular to a plane of the substrate, an orthographic projection of the strip-shaped electrode part comprises a first electrode edge adjacent to the first sub-electrode, the first electrode edge is of an arc shape, and the first electrode edge is convex in a direction towards the first sub-electrode.

33. The display panel according to claim 28, wherein an edge of the second sub-electrode is adjacent to an edge of the first sub-electrode, and the two adjacent edges are both straight-line edges.

34. The display panel according to claim 28, wherein in a direction from the first sub-electrode to the second sub-electrode, the second sub-electrode inclines towards a light-exiting plane of the display panel.

* * * * *